(12) United States Patent
June et al.

(10) Patent No.: US 8,893,513 B2
(45) Date of Patent: Nov. 25, 2014

(54) THERMOELECTRIC HEAT EXCHANGER COMPONENT INCLUDING PROTECTIVE HEAT SPREADING LID AND OPTIMAL THERMAL INTERFACE RESISTANCE

(71) Applicant: Phononic Devices, Inc., Durham, NC (US)

(72) Inventors: M. Sean June, Raleigh, NC (US); Robert Joseph Therrien, Cary, NC (US); Abhishek Yadav, Raleigh, NC (US); Jesse W. Edwards, Cary, NC (US)

(73) Assignee: Phononic Device, Inc., Durham, NC (US)

( * ) Notice: Subject to any disclaimer, the term of this patent is extended or adjusted under 35 U.S.C. 154(b) by 0 days.

(21) Appl. No.: 13/888,847

(22) Filed: May 7, 2013

(65) Prior Publication Data

US 2013/0291559 A1 Nov. 7, 2013

Related U.S. Application Data

(60) Provisional application No. 61/643,622, filed on May 7, 2012, provisional application No. 61/643,625, filed on May 7, 2012.

(51) Int. Cl.
*F25B 21/02* (2006.01)
*F25B 21/00* (2006.01)
*H05K 1/18* (2006.01)
*H05K 1/02* (2006.01)

(52) U.S. Cl.
CPC .............. *F25B 21/00* (2013.01); *H05K 1/0204* (2013.01); *F25B 21/02* (2013.01); *H05K 1/182* (2013.01); *H05K 2201/10219* (2013.01); *H05K 2201/066* (2013.01)
USPC ................................ 62/3.7; 62/3.2

(58) Field of Classification Search
CPC ........ F25B 2321/02; F25B 21/02; F25B 21/04
USPC .................... 62/3.2, 3.7; 165/134.1
See application file for complete search history.

(56) References Cited

U.S. PATENT DOCUMENTS 2,027,057 A 1/1936 Munters
2,947,150 A 8/1960 Roeder, Jr.
(Continued)

FOREIGN PATENT DOCUMENTS

DE 20105487 U1 10/2001
EP 0484034 A1 5/1992
(Continued)

OTHER PUBLICATIONS

Author Unknown, "Heat Pipe", Wikipedia—the free encyclopedia, Updated Jul. 9, 2013, Retrieved Jul. 19, 2013, http://en.wikipedia.org/wiki/Heat_Pipe, 10 pages.

(Continued)

*Primary Examiner* — Ljiljana Ciric
*Assistant Examiner* — Alexis Cox
(74) *Attorney, Agent, or Firm* — Withrow & Terranova, PLLC

(57) ABSTRACT

A thermoelectric heat exchanger component includes a circuit board and multiple thermoelectric devices attached to the circuit board. Heights of at least two of the thermoelectric devices are different due to, for example, tolerances in a manufacturing process for the thermoelectric devices. The thermoelectric heat exchanger component also includes a first heat spreading lid over a first surface of the thermoelectric devices and a second heat spreading lid over a second surface of the thermoelectric devices. A thermal interface material is present between each one of the thermoelectric devices and the first and second heat spreading lids. The first heat spreading lid and the second heat spreading lid are oriented such that the thickness of the thermal interface material, and thus a thermal interface resistance, is optimized for the thermoelectric devices.

26 Claims, 8 Drawing Sheets

(56) References Cited

U.S. PATENT DOCUMENTS

| | | |
|---|---|---|
| 3,100,969 A | 8/1963 | Elfving |
| 3,191,391 A | 6/1965 | Müller |
| 3,393,127 A | 7/1968 | Detman et al. |
| 3,532,159 A | 10/1970 | Hammitt et al. |
| 3,621,906 A | 11/1971 | Leffert |
| 3,821,881 A | 7/1974 | Harkias |
| 4,011,104 A | 3/1977 | Basiulis |
| 4,213,448 A | 7/1980 | Hebert |
| 4,278,906 A | 7/1981 | Kullmann |
| 4,306,613 A | 12/1981 | Christopher |
| 4,335,578 A | 6/1982 | Osborn et al. |
| 4,357,932 A | 11/1982 | Stacy |
| 4,366,857 A | 1/1983 | Mayer |
| 4,382,466 A | 5/1983 | Shiraishi |
| 4,383,414 A * | 5/1983 | Beitner ............... 62/3.6 |
| 4,393,663 A | 7/1983 | Grunes et al. |
| 4,449,377 A | 5/1984 | Draper |
| 4,474,228 A | 10/1984 | Rogalski et al. |
| 4,476,922 A | 10/1984 | Heilig, Jr. et al. |
| 4,498,306 A | 2/1985 | Tyree, Jr. |
| 4,505,261 A | 3/1985 | Hunter |
| 4,513,732 A | 4/1985 | Feldman, Jr. |
| 4,545,364 A | 10/1985 | Maloney |
| 4,546,608 A | 10/1985 | Shiina et al. |
| 4,607,498 A | 8/1986 | Dinh |
| 4,687,048 A | 8/1987 | Edelstein et al. |
| 4,700,771 A | 10/1987 | Bennett et al. |
| 4,796,439 A | 1/1989 | Yamada et al. |
| 4,810,460 A | 3/1989 | Gluntz |
| 4,833,567 A | 5/1989 | Saaski et al. |
| 4,842,050 A | 6/1989 | Harper |
| 4,848,445 A | 7/1989 | Harper |
| 5,000,252 A | 3/1991 | Faghri |
| 5,069,274 A | 12/1991 | Haslett et al. |
| 5,161,090 A | 11/1992 | Crawford et al. |
| 5,190,098 A | 3/1993 | Long |
| 5,195,575 A | 3/1993 | Wylie |
| 5,309,725 A | 5/1994 | Cayce |
| 5,333,677 A | 8/1994 | Molivadas |
| 5,355,678 A * | 10/1994 | Beitner ............... 62/3.2 |
| 5,384,051 A | 1/1995 | McGinness |
| 5,385,203 A | 1/1995 | Mitsuhashi et al. |
| 5,386,701 A | 2/1995 | Cao |
| 5,400,607 A | 3/1995 | Cayce |
| 5,406,805 A | 4/1995 | Radermacher et al. |
| 5,408,847 A | 4/1995 | Erickson |
| 5,411,077 A | 5/1995 | Tousignant |
| 5,456,081 A * | 10/1995 | Chrysler et al. ........ 62/3.7 |
| 5,458,189 A | 10/1995 | Larson et al. |
| 5,477,706 A | 12/1995 | Kirol et al. |
| 5,551,244 A | 9/1996 | Bailey |
| 5,558,783 A | 9/1996 | McGuinness |
| 5,579,830 A | 12/1996 | Giammaruti |
| 5,587,880 A | 12/1996 | Phillips et al. |
| 5,596,981 A | 1/1997 | Soucy |
| 5,598,721 A | 2/1997 | Rockenfeller et al. |
| 5,622,057 A | 4/1997 | Bussjager et al. |
| 5,628,205 A | 5/1997 | Rockenfeller et al. |
| 5,647,429 A | 7/1997 | Oktay et al. |
| 5,655,598 A | 8/1997 | Garriss et al. |
| 5,695,007 A | 12/1997 | Fauconnier et al. |
| 5,704,416 A | 1/1998 | Larson et al. |
| 5,737,840 A | 4/1998 | Akachi |
| 5,737,923 A | 4/1998 | Gilley et al. |
| 5,770,903 A | 6/1998 | Bland et al. |
| 5,864,466 A | 1/1999 | Remsburg |
| 5,890,371 A | 4/1999 | Rajasubramanian et al. |
| 5,931,156 A | 8/1999 | Wang et al. |
| 5,966,939 A | 10/1999 | Tauchi |
| 5,970,719 A | 10/1999 | Merritt |
| 6,003,319 A | 12/1999 | Gilley et al. |
| 6,006,998 A | 12/1999 | Rerolle |
| 6,014,968 A | 1/2000 | Teoh |
| 6,019,165 A | 2/2000 | Batchelder |
| 6,021,844 A | 2/2000 | Batchelder |
| 6,055,157 A | 4/2000 | Bartilson |
| RE36,684 E | 5/2000 | Rockenfeller et al. |
| 6,064,572 A | 5/2000 | Remsburg |
| 6,073,888 A | 6/2000 | Gelon et al. |
| 6,097,597 A | 8/2000 | Kobayashi |
| 6,109,044 A | 8/2000 | Porter et al. |
| 6,148,905 A | 11/2000 | Sehmbey |
| 6,158,502 A | 12/2000 | Thomas |
| 6,161,388 A | 12/2000 | Ghoshal |
| 6,167,948 B1 | 1/2001 | Thomas |
| 6,192,979 B1 | 2/2001 | Koch et al. |
| 6,234,242 B1 | 5/2001 | Sehmbey et al. |
| 6,237,223 B1 | 5/2001 | McCullough |
| 6,237,682 B1 | 5/2001 | Bowers et al. |
| 6,294,853 B1 | 9/2001 | Lin et al. |
| 6,314,741 B1 | 11/2001 | Hiraishi |
| 6,347,521 B1 | 2/2002 | Kadotani et al. |
| 6,360,813 B1 | 3/2002 | Katoh et al. |
| 6,382,309 B1 | 5/2002 | Kroliczek et al. |
| 6,388,882 B1 | 5/2002 | Hoover et al. |
| 6,410,982 B1 | 6/2002 | Brownell et al. |
| 6,418,729 B1 | 7/2002 | Dominguez-Alonso et al. |
| 6,463,743 B1 | 10/2002 | Laliberté |
| 6,499,777 B1 | 12/2002 | Wang |
| 6,533,029 B1 | 3/2003 | Phillips |
| 6,536,510 B2 | 3/2003 | Khrustalev et al. |
| 6,549,408 B2 | 4/2003 | Berchowitz |
| 6,557,354 B1 | 5/2003 | Chu et al. |
| 6,564,860 B1 | 5/2003 | Kroliczek et al. |
| 6,568,857 B1 | 5/2003 | Richard et al. |
| 6,585,039 B2 | 7/2003 | Sagal et al. |
| 6,631,624 B1 | 10/2003 | Kirol et al. |
| 6,631,755 B1 | 10/2003 | Kung et al. |
| 6,642,485 B2 | 11/2003 | Goenka et al. |
| 6,657,121 B2 | 12/2003 | Garner |
| 6,658,857 B1 | 12/2003 | George |
| 6,672,373 B2 | 1/2004 | Smyrnov |
| 6,679,316 B1 | 1/2004 | Lin et al. |
| 6,681,487 B2 | 1/2004 | Sagal et al. |
| 6,698,502 B1 | 3/2004 | Lee |
| 6,739,138 B2 | 5/2004 | Saunders et al. |
| 6,745,830 B2 | 6/2004 | Dinh |
| 6,771,498 B2 | 8/2004 | Wang et al. |
| 6,789,610 B1 | 9/2004 | Hegde |
| 6,804,117 B2 | 10/2004 | Phillips et al. |
| 6,808,011 B2 | 10/2004 | Lindemuth et al. |
| 6,828,675 B2 | 12/2004 | Memory et al. |
| 6,866,092 B1 | 3/2005 | Molivadas |
| 6,889,753 B2 | 5/2005 | Takamizawa et al. |
| 6,889,754 B2 | 5/2005 | Kroliczek et al. |
| 6,972,365 B2 | 12/2005 | Garner |
| 6,994,151 B2 | 2/2006 | Zhou et al. |
| 7,004,240 B1 | 2/2006 | Kroliczek et al. |
| 7,013,955 B2 | 3/2006 | Phillips et al. |
| 7,013,956 B2 | 3/2006 | Thayer et al. |
| 7,032,389 B2 | 4/2006 | Cauchy |
| 7,061,763 B2 | 6/2006 | Tsoi |
| 7,069,975 B1 | 7/2006 | Haws et al. |
| 7,071,408 B2 | 7/2006 | Garner |
| 7,077,189 B1 | 7/2006 | Reyzin et al. |
| 7,096,928 B2 | 8/2006 | Phillips et al. |
| 7,102,267 B2 | 9/2006 | Gromoll et al. |
| 7,124,594 B2 | 10/2006 | McRell |
| 7,127,023 B2 | 10/2006 | Wieland |
| 7,131,484 B2 | 11/2006 | Gayrard et al. |
| 7,143,818 B2 | 12/2006 | Thayer et al. |
| 7,156,279 B2 | 1/2007 | Goenke et al. |
| 7,162,878 B2 | 1/2007 | Narayanamurthy et al. |
| 7,174,950 B2 | 2/2007 | Jacqué et al. |
| 7,185,512 B2 | 3/2007 | Badie et al. |
| 7,212,403 B2 | 5/2007 | Rockenfeller |
| 7,212,409 B2 | 5/2007 | Belady et |
| 7,215,541 B2 | 5/2007 | Nelson |
| 7,227,749 B2 | 6/2007 | Rockenfeller |
| 7,231,961 B2 | 6/2007 | Alex et al. |
| 7,251,889 B2 | 8/2007 | Kroliczek et al. |
| 7,266,969 B2 | 9/2007 | Hsu et al. |
| 7,266,976 B2 | 9/2007 | Eaton et al. |
| 7,282,678 B2 | 10/2007 | Tung et al. |

(56) References Cited

U.S. PATENT DOCUMENTS

| | | | |
|---|---|---|---|
| 7,285,802 B2 | 10/2007 | Ouderkirk et al. |
| 7,304,842 B2 | 12/2007 | Yatskov |
| 7,310,971 B2 | 12/2007 | Eaton et al. |
| 7,325,590 B2 | 2/2008 | Kim et al. |
| 7,334,630 B2 | 2/2008 | Goodson et al. |
| 7,380,584 B2 | 6/2008 | Ippoushi et al. |
| 7,406,999 B2 | 8/2008 | Bhatti et al. |
| 7,416,017 B2 | 8/2008 | Haws et al. |
| 7,424,906 B2 | 9/2008 | Bhatti et al. |
| 7,448,222 B2 | 11/2008 | Bormann |
| 7,475,718 B2 | 1/2009 | Reyzin et al. |
| 7,477,516 B2 | 1/2009 | Joshi et al. |
| 7,487,643 B2 | 2/2009 | Chen et al. |
| 7,497,249 B2 | 3/2009 | Bhatti et al. |
| 7,505,268 B2 | 3/2009 | Schick |
| 7,506,682 B2 | 3/2009 | Bhatti et al. |
| 7,509,995 B2 | 3/2009 | Bhatti et al. |
| 7,512,206 B2 | 3/2009 | Wieland |
| 7,520,317 B2 | 4/2009 | Rusch et al. |
| 7,532,467 B2 | 5/2009 | Launay et al. |
| 7,556,086 B2 | 7/2009 | Joshi et al. |
| 7,556,088 B2 | 7/2009 | Joshi et al. |
| 7,556,089 B2 | 7/2009 | Bhatti et al. |
| 7,566,999 B2 | 7/2009 | Neal |
| 7,604,040 B2 | 10/2009 | Ghosh et al. |
| 7,623,350 B2 * | 11/2009 | Tien et al. ............... 361/719 |
| 7,629,716 B2 | 12/2009 | Neal |
| 7,642,644 B2 | 1/2010 | Wilkins et al. |
| 7,644,753 B2 | 1/2010 | Ghosh et al. |
| 7,650,928 B2 | 1/2010 | Bhatti et al. |
| 7,665,511 B2 | 2/2010 | Bhatti et al. |
| 7,683,509 B2 | 3/2010 | Neal |
| 7,708,053 B2 | 5/2010 | Kroliczek et al. |
| 7,770,632 B2 | 8/2010 | Bhatti et al. |
| 7,841,305 B2 | 11/2010 | King et al. |
| 7,841,387 B2 | 11/2010 | Ippoushi et al. |
| 7,854,129 B2 | 12/2010 | Narayanamurthy |
| 7,928,348 B2 | 4/2011 | Neal |
| 7,954,331 B2 | 6/2011 | Ullman |
| 7,958,935 B2 | 6/2011 | Belits et al. |
| 8,016,024 B2 | 9/2011 | Kang et al. |
| 8,033,017 B2 | 10/2011 | Kim et al. |
| 8,066,055 B2 | 11/2011 | Kroliczek et al. |
| 8,109,325 B2 | 2/2012 | Kroliczek et al. |
| 8,136,580 B2 | 3/2012 | Kroliczek et al. |
| 8,213,471 B2 | 7/2012 | Schlie et al. |
| 8,216,871 B2 | 7/2012 | McCann |
| 8,217,557 B2 | 7/2012 | Sills et al. |
| 8,763,408 B2 | 7/2014 | Ma et al. |
| 2001/0023762 A1 | 9/2001 | Sagal |
| 2002/0023456 A1 | 2/2002 | Sone |
| 2002/0038550 A1 * | 4/2002 | Gillen ............... 62/3.7 |
| 2002/0070486 A1 | 6/2002 | Kim et al. |
| 2003/0029174 A1 | 2/2003 | Lee |
| 2003/0075306 A1 | 4/2003 | Zuo et al. |
| 2003/0111516 A1 | 6/2003 | Ghoshal |
| 2003/0121515 A1 | 7/2003 | Yu-Chu et al. |
| 2003/0159806 A1 | 8/2003 | Sehmbey et al. |
| 2005/0011199 A1 | 1/2005 | Grisham et al. |
| 2005/0056403 A1 | 3/2005 | Norlin et al. |
| 2005/0061486 A1 | 3/2005 | Yang |
| 2005/0172644 A1 | 8/2005 | Zhang et al. |
| 2006/0088746 A1 | 4/2006 | Tuma et al. |
| 2006/0108097 A1 * | 5/2006 | Hodes et al. ............... 165/80.4 |
| 2006/0162903 A1 | 7/2006 | Bhatti et al. |
| 2006/0254753 A1 | 11/2006 | Phillips et al. |
| 2007/0028626 A1 | 2/2007 | Chen |
| 2007/0028955 A1 | 2/2007 | Sogou et al. |
| 2007/0101730 A1 | 5/2007 | Chen et al. |
| 2007/0227701 A1 | 10/2007 | Bhatti et al. |
| 2007/0227703 A1 | 10/2007 | Bhatti et al. |
| 2007/0246193 A1 | 10/2007 | Bhatti et al. |
| 2007/0246195 A1 | 10/2007 | Bhatti et al. |
| 2007/0256427 A1 * | 11/2007 | Tateyama et al. ............... 62/3.7 |
| 2007/0267180 A1 | 11/2007 | Asfia et al. |
| 2008/0012436 A1 | 1/2008 | Neal |
| 2008/0013283 A1 | 1/2008 | Gilbert et al. |
| 2008/0022696 A1 | 1/2008 | Welle et al. |
| 2008/0047692 A1 | 2/2008 | Weinstein |
| 2008/0049384 A1 | 2/2008 | Unternaehrer et al. |
| 2008/0098750 A1 | 5/2008 | Busier |
| 2008/0179047 A1 | 7/2008 | Yesin et al. |
| 2008/0202155 A1 | 8/2008 | Taras et al. |
| 2008/0209919 A1 | 9/2008 | Ackermann et al. |
| 2008/0236175 A1 | 10/2008 | Chaparro Monferrer et al. |
| 2009/0000310 A1 | 1/2009 | Bell et al. |
| 2009/0056916 A1 | 3/2009 | Yesin et al. |
| 2009/0064411 A1 | 3/2009 | Marquette et al. |
| 2009/0126905 A1 | 5/2009 | Dinh |
| 2009/0139263 A1 | 6/2009 | Brostow et al. |
| 2009/0229794 A1 | 9/2009 | Schon |
| 2009/0293504 A1 | 12/2009 | Oomen et al. |
| 2009/0308571 A1 | 12/2009 | Thompson et al. |
| 2009/0314472 A1 | 12/2009 | Kim et al. |
| 2010/0000233 A1 | 1/2010 | Groothuis et al. |
| 2010/0006265 A1 | 1/2010 | De Larminat et al. |
| 2010/0031991 A1 | 2/2010 | Mochizuki et al. |
| 2010/0043463 A1 | 2/2010 | Fleming et al. |
| 2010/0059880 A1 | 3/2010 | Baek |
| 2010/0078061 A1 | 4/2010 | Lu et al. |
| 2010/0154109 A1 | 6/2010 | Roseberry |
| 2010/0155034 A1 | 6/2010 | Müller et al. |
| 2010/0186820 A1 | 7/2010 | Schon |
| 2010/0248968 A1 | 9/2010 | Stautner |
| 2010/0288586 A1 | 11/2010 | Gorbounov et al. |
| 2010/0300654 A1 | 12/2010 | Edwards |
| 2010/0305918 A1 | 12/2010 | Udell |
| 2010/0326627 A1 | 12/2010 | Schon |
| 2010/0326632 A1 | 12/2010 | Nagai et al. |
| 2011/0030400 A1 | 2/2011 | Agostini et al. |
| 2011/0043092 A1 | 2/2011 | Shuja et al. |
| 2011/0048676 A1 | 3/2011 | Toyoda et al. |
| 2011/0073284 A1 | 3/2011 | Yoo et al. |
| 2011/0083446 A1 | 4/2011 | Pinet |
| 2011/0120673 A1 | 5/2011 | Xiang et al. |
| 2011/0162829 A1 | 7/2011 | Xiang |
| 2011/0174003 A1 | 7/2011 | Wenger |
| 2011/0203777 A1 | 8/2011 | Zhao et al. |
| 2011/0206965 A1 | 8/2011 | Han et al. |
| 2011/0259041 A1 | 10/2011 | Kuehl et al. |
| 2011/0272319 A1 | 11/2011 | Koivuluoma et al. |
| 2011/0277967 A1 | 11/2011 | Fried et al. |
| 2011/0284189 A1 | 11/2011 | Sinha et al. |
| 2011/0289953 A1 | 12/2011 | Alston |
| 2011/0308709 A1 | 12/2011 | Ouellette |
| 2012/0017625 A1 | 1/2012 | Kroliczek et al. |
| 2012/0019098 A1 | 1/2012 | Erbil et al. |
| 2012/0024497 A1 | 2/2012 | Kroliczek et al. |
| 2012/0047917 A1 | 3/2012 | Rafalovich |
| 2012/0067558 A1 | 3/2012 | Phan et al. |
| 2012/0087090 A1 | 4/2012 | Feng et al. |
| 2012/0090343 A1 | 4/2012 | Couto et al. |
| 2012/0111553 A1 | 5/2012 | Tsoi et al. |
| 2012/0131932 A1 | 5/2012 | Kroliczek et al. |
| 2012/0140403 A1 | 6/2012 | Lau et al. |
| 2012/0175087 A1 | 7/2012 | Kroliczek et al. |
| 2012/0176794 A1 | 7/2012 | Joung et al. |
| 2013/0025295 A1 | 1/2013 | Brehm et al. |
| 2013/0291555 A1 | 11/2013 | Edwards et al. |
| 2013/0291556 A1 | 11/2013 | Edwards et al. |
| 2013/0291557 A1 | 11/2013 | Edwards et al. |
| 2013/0291558 A1 | 11/2013 | Edwards et al. |
| 2013/0291560 A1 | 11/2013 | Therrien et al. |
| 2013/0291561 A1 | 11/2013 | Edwards et al. |
| 2013/0291562 A1 | 11/2013 | Edwards et al. |
| 2013/0291563 A1 | 11/2013 | Edwards et al. |
| 2013/0291564 A1 | 11/2013 | Ghoshal et al. |

FOREIGN PATENT DOCUMENTS

| | | |
|---|---|---|
| EP | 0910535 A1 | 4/1999 |
| EP | 0697085 B1 | 9/1999 |
| EP | 1003006 A1 | 5/2000 |
| EP | 1505662 A2 | 2/2005 |

(56) References Cited

FOREIGN PATENT DOCUMENTS

| | | |
|---|---|---|
| EP | 1388444 B1 | 2/2006 |
| EP | 1553841 B1 | 5/2006 |
| EP | 1909053 A2 | 4/2008 |
| EP | 1639060 B1 | 5/2008 |
| EP | 1967808 A1 | 9/2008 |
| EP | 2276046 A1 | 1/2011 |
| EP | 2330067 A1 | 6/2011 |
| EP | 2463870 A1 | 6/2012 |
| GB | 2404086 A | 1/2005 |
| JP | 54048350 A | 4/1979 |
| JP | 56012997 A | 2/1981 |
| JP | 57196089 A | 12/1982 |
| JP | 57202494 A | 12/1982 |
| JP | 58123091 A | 7/1983 |
| JP | 58174109 A | 10/1983 |
| JP | 58178191 A | 10/1983 |
| JP | 58198648 A | 11/1983 |
| JP | 60253791 A | 12/1985 |
| JP | 61142635 A | 6/1986 |
| JP | 61228292 A | 10/1986 |
| JP | 62041531 A | 2/1987 |
| JP | 62284147 A | 12/1987 |
| JP | 62294897 A | 12/1987 |
| JP | 1222825 A | 9/1989 |
| JP | 2238117 A | 9/1990 |
| JP | 04174269 A | 6/1992 |
| JP | 9164316 A | 6/1997 |
| JP | 9222286 A | 8/1997 |
| JP | 9273877 A | 10/1997 |
| JP | 11063862 A | 3/1999 |
| JP | 3054098 B2 | 6/2000 |
| JP | 2001330339 A | 11/2001 |
| JP | 3273669 B2 | 4/2002 |
| JP | 2003244968 A | 8/2003 |
| JP | 2003343985 A | 12/2003 |
| JP | 2004140429 A | 5/2004 |
| JP | 2004278968 A | 10/2004 |
| JP | 2005315462 A | 11/2005 |
| JP | 2007093112 A | 4/2007 |
| JP | 4039380 B2 | 1/2008 |
| JP | 2008311399 A | 12/2008 |
| JP | 2009115396 A | 5/2009 |
| JP | 2009206113 A | 9/2009 |
| KR | 2004067701 A | 7/2004 |
| KR | 2005017631 A | 2/2005 |
| KR | 2005017738 A | 2/2005 |
| KR | 2005112427 A | 11/2005 |
| KR | 539044 B1 | 12/2005 |
| KR | 2005121128 A | 12/2005 |
| KR | 2006005748 A | 1/2006 |
| KR | 2006033321 A | 4/2006 |
| KR | 2006108680 A | 10/2006 |
| KR | 757614 B1 | 9/2007 |
| KR | 2007102889 A | 10/2007 |
| KR | 820448 B1 | 4/2008 |
| KR | 870985 B1 | 12/2008 |
| WO | 2010088433 A1 | 8/2010 |
| WO | 2011127416 A2 | 10/2011 |
| WO | 2012033476 A1 | 3/2012 |
| WO | 2012169989 A1 | 12/2012 |
| WO | 2013074057 A1 | 5/2013 |
| WO | 2013169874 A1 | 11/2013 |

OTHER PUBLICATIONS

Habte, Melaku, "Thermal Hydraulic Analysis of Two-Phase Closed Thermosyphon Cooling System for New Cold Neutron Source Moderator of Breazeale Research Reactor at Penn State," Dissertation for Pennsylvania State University Graduate School, Aug. 2008, 218 pages.

Kambe, Mitsuru et al., "Encapsulated Thermoelectric Modules and Compliant Pads for Advanced Thermoelectric Systems," Manuscript for Central Research Institute of Electric Power Industry (CRIEPI), Copyright: 2009, 8 pages.

Non-Final Office Action for U.S. Appl. No. 13/867,519, mailed Oct. 4, 2013, 12 pages.

Non-Final Office Action for U.S. Appl. No. 13/867,567, mailed Oct. 2, 2013, 9 pages.

Non-Final Office Action for U.S. Appl. No. 13/867,589, mailed Oct. 3, 2013, 9 pages.

Non-Final Office Action for U.S. Appl. No. 13/888,799, mailed Sep. 4, 2013, 19 pages.

Non-Final Office Action for U.S. Appl. No. 13/888,820, mailed Oct. 9, 2013, 10 pages.

Non-Final Office Action for U.S. Appl. No. 13/888,833, mailed Oct. 2, 2013, 11 pages.

Invitation to Pay Additional Fees for PCT/US2013/039943, mailed Aug. 19, 2013, 6 pages.

International Search Report and Written Opinion for PCT/US2013/039943, mailed Oct. 28, 2013, 14 pages.

Non-Final Office Action for U.S. Appl. No. 13/888,791, mailed Nov. 22, 2013, 17 pages.

Non-Final Office Action for U.S. Appl. No. 13/836,525, mailed Nov. 25, 2013, 21 pages.

Final Office Action for U.S. Appl. No. 13/888,799, mailed Dec. 24, 2013, 18 pages.

International Search Report and Written Opinion for PCT/US2013/039945, mailed Dec. 9, 2013, 9 pages.

International Preliminary Report on Patentability for PCT/US2013/039943, mailed Apr. 28, 2014, 9 pages.

Final Office Action for U.S. Appl. No. 13/867,567, mailed May 1, 2014, 11 pages.

Final Office Action for U.S. Appl. No. 13/867,589, mailed Apr. 24, 2014, 12 pages.

Advisory Action for U.S. Appl. No. 13/888,799, mailed Mar. 6, 2014, 4 pages.

Non-Final Office Action for U.S. Appl. No. 13/888,799, mailed Apr. 29, 2014, 18 pages.

Final Office Action for U.S. Appl. No. 13/888,820, mailed Apr. 24, 2014, 13 pages.

Final Office Action for U.S. Appl. No. 13/888,833, mailed May 1, 2014, 11 pages.

Final Office Action for U.S. Appl. No. 13/888,791, mailed Jun. 4, 2014, 20 pages.

Final Office Action for U.S. Appl. No. 13/867,519, mailed May 1, 2014, 15 pages.

International Preliminary Report on Patentability for PCT/US2013/039945, mailed Jul. 28, 2014, 8 pages.

Author Unknown, "Thermoelectric Technical Reference—Heat Sink Considerations," Ferrotec's Thermoelectric Technical Reference Guide, https://www.thermalferrotec.com/technology/thermo-electric/thermalRef05, accessed Aug. 11, 2014, Ferrotec (USA) Corporation, 2 pages.

Dousti, Mohammad Javad et al., "Power-Aware Deployment and Control of Forced-Convection and Thermoelectric Coolers," Proceedings of the 51st Annual Design Automation Conference, Jun. 1-5, 2014, San Francisco, CA, Association for Computing Machinery, pp. 1-6.

Ghoshal, U. et al., "Efficient Switched Thermoelectric Refrigerators for Cold Storage Applications," Journal of Electronic Materials, vol. 38, Issue 7, Jul. 1, 2009, Springer US, pp. 1148-1153.

Advisory Action and Examiner-Initiated Interview Summary for U.S. Appl. No. 13/867,519, mailed Aug. 7, 2014, 5 pages.

Advisory Action for U.S. Appl. No. 13/867,519, mailed Aug. 19, 2014, 3 pages.

Advisory Action and Examiner-Initiated Interview Summary for U.S. Appl. No. 13/867,567, mailed Sep. 11, 2014, 5 pages.

Advisory Action and Examiner-Initiated Interview Summary for U.S. Appl. No. 13/867,589, mailed Aug. 7, 2014, 5 pages.

(56) References Cited

OTHER PUBLICATIONS

Advisory Action for U.S. Appl. No. 13/867,589, mailed Aug. 19, 2014, 3 pages.
Final Office Action for U.S. Appl. No. 13/888,799, mailed Aug. 15, 2014, 17 pages.
Advisory Action and Examiner-Initiated Interview Summary for U.S. Appl. No. 13/888,820 mailed Aug. 25, 2014, 5 pages.
Advisory Action and Examiner-Initiated Interview Summary for U.S. Appl. No. 13/888,833, mailed Sep. 3, 2014, 4 pages.
Advisory Action and Examiner-Initiated Interview Summary for U.S. Appl. No. 13/888,791, mailed Sep. 3, 2014, 5 pages.

* cited by examiner

THERMOELECTRIC HEAT EXCHANGER COMPONENT INCLUDING PROTECTIVE HEAT SPREADING LID AND OPTIMAL THERMAL INTERFACE RESISTANCE

RELATED APPLICATIONS

This application claims the benefit of provisional patent application Ser. No. 61/643,622, filed May 7, 2012 and provisional patent application Ser. No. 61/643,625, filed May 7, 2012, the disclosures of which are hereby incorporated herein by reference in their entireties.

FIELD OF THE DISCLOSURE

The present disclosure relates to a thermoelectric heat exchanger.

BACKGROUND

Thin film thermoelectric devices are typically much smaller and more fragile than comparable bulk-type thermoelectric modules. An area for a typical thin film thermoelectric device is on the order of 140 square millimeters ($mm^2$) whereas an area of a typical bulk-type thermoelectric module is on the order of 1,600 $mm^2$. Thin film thermoelectric devices can be disposed between heat sinks to form a thermoelectric heat exchanger. A thermal resistance of a thermal interface material between a thermoelectric device and an attached heat sink is defined as l/kA, where l is a thickness of the thermal interface material, k is a thermal conductivity of the thermal interface material, and A is an area of an interface between the thermoelectric device and the heat sink. This means that the thermal resistance of the thermal interface material between a thin film thermoelectric device and a heat sink is on the order of 10 times higher than the thermal resistance of the thermal interface material between a larger bulk-type thermoelectric module and a corresponding heat sink. For thin film thermoelectric devices and, in particular, thin film thermoelectric coolers, the higher thermal resistance of the thermal interface material results in a higher hot side temperature and requires a lower cold side temperature, which leads to higher power consumption and/or inability to cool adequately.

In addition, given their dimensions and material set, thin film thermoelectric devices cannot withstand as much mechanical loading as bulk-type thermoelectric modules. Further, thin film thermoelectric devices cannot withstand uneven mechanical loading. However, heat sinks attached to both sides of thin film thermoelectric devices tend to be quite large compared to the thin film thermoelectric devices and are often constrained in a given product. As such, it is difficult to get even, controlled loading on a thin film thermoelectric device.

Therefore, there is a need for systems and methods for minimizing the thermal resistance of the thermal interface material between thin film thermoelectric devices while also protecting the thin film thermoelectric devices from mechanical loading.

SUMMARY

Embodiments of a thermoelectric heat exchanger component having a heat spreading lid that optimizes thermal interface resistance between the heat spreading lid and multiple thermoelectric devices and methods of fabrication thereof are disclosed. In one embodiment, a thermoelectric heat exchanger component includes a circuit board and multiple thermoelectric devices attached to the circuit board. Heights of at least two of the thermoelectric devices are different due to, for example, tolerances in a manufacturing process for the thermoelectric devices. The thermoelectric heat exchanger also includes a heat spreading lid over the thermoelectric devices and a thermal interface material between the thermoelectric devices and the heat spreading lid. An orientation (i.e., a tilt) of the heat spreading lid is such that a thickness of the thermal interface material, and thus a thermal interface resistance, is optimized for the thermoelectric devices, which in turn optimizes the thermal interface resistance of the thermal interface material between the thermoelectric devices and the heat spreading lid.

In one embodiment, the heat spreading lid includes a body and multiple pedestals of equal heights relative to the body of the heat spreading lid that extend from the body of the heat spreading lid toward the thermoelectric devices. Each of the pedestals is aligned with a corresponding one of the thermoelectric devices. In this embodiment, the thermal interface material is between a surface of each pedestal and a surface of the corresponding thermoelectric device, and the orientation of the heat spreading lid is such that the thickness of the thermal interface material between each pedestal and the corresponding thermoelectric device is optimized. In one embodiment, the heat spreading lid further includes a lip that extends from the body of the heat spreading lid around a periphery of the heat spreading lid. In one embodiment, a height of the lip relative to the body of the heat spreading lid is such that, for any combination of heights of the thermoelectric devices within a predefined range, at least a predefined minimum gap is maintained between the lip of the heat spreading lid and the circuit board, wherein the predefined minimum gap is greater than zero.

In one embodiment, the thermoelectric devices are attached to a first surface of the circuit board, and the heat spreading lid is over surfaces of the thermoelectric devices opposite the first surface of the circuit board. In another embodiment, the thermoelectric devices are attached to a first surface of the circuit board, and the heat spreading lid is over surfaces of the thermoelectric devices exposed at a second surface of the circuit board through one or more holes through the circuit board.

In another embodiment, the thermoelectric devices are attached to a first surface of the circuit board, and the heat spreading lid is over surfaces of the thermoelectric devices opposite the first surface of the circuit board. In this embodiment, the thermoelectric heat exchanger component further comprises a second heat spreading lid over surfaces of the thermoelectric devices exposed at a second surface of the circuit board through one or more holes through the circuit board.

In one embodiment, a thermoelectric heat exchanger component is fabricated by attaching multiple thermoelectric devices to a circuit board. Two or more of the thermoelectric devices have different heights due to, for example, tolerances in a manufacturing process of the thermoelectric devices. A thermal interface material is applied to surfaces of the thermoelectric devices and/or a heat spreading lid. The heat spreading lid is then positioned over the thermoelectric devices, and a ball point force is applied to the heat spreading lid. As a result of the ball point force, the heat spreading lid settles at an orientation at which a thickness of the thermal interface material is optimized for the thermoelectric devices.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
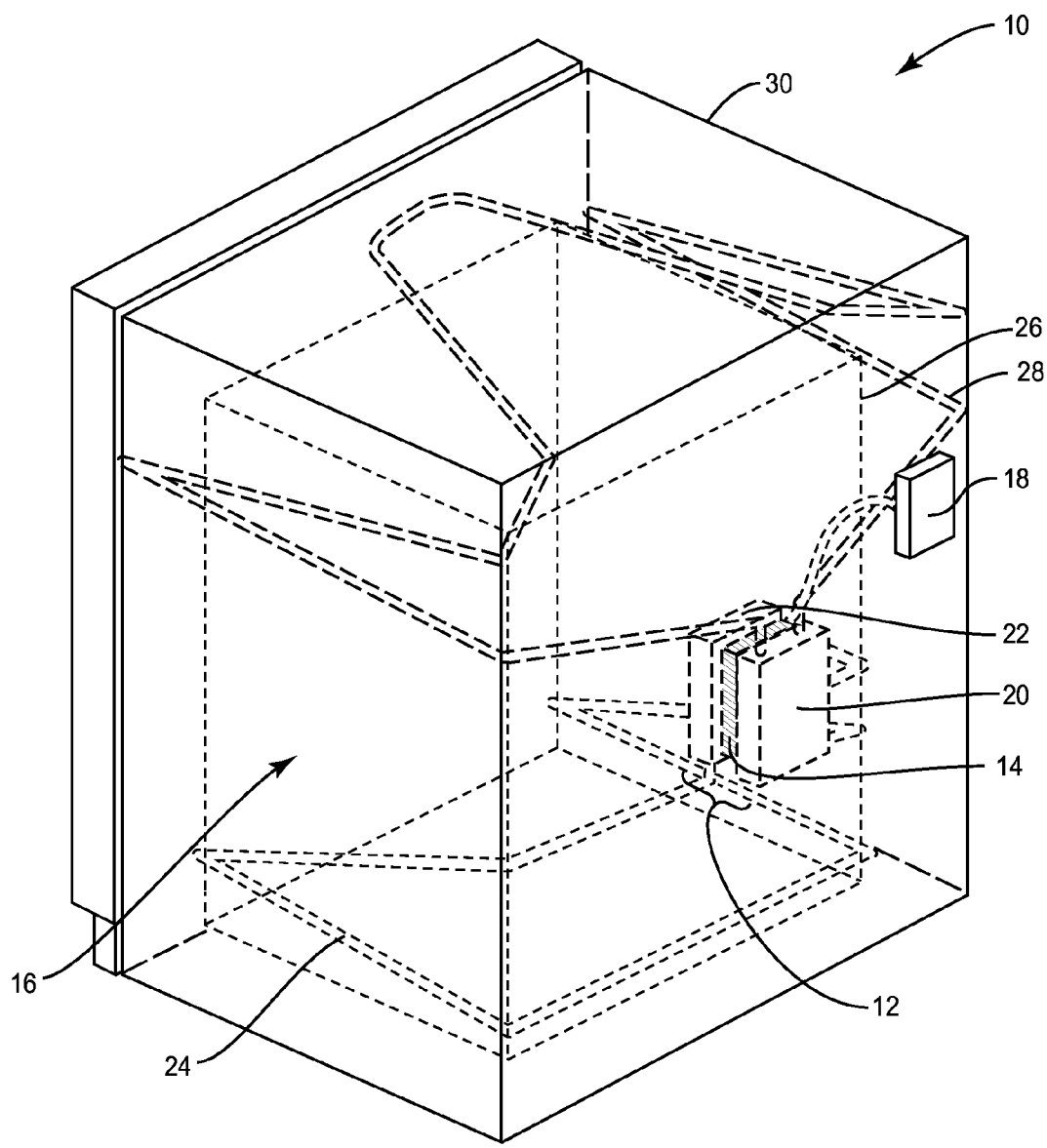
FIG. 1 illustrates a thermoelectric refrigeration system including a thermoelectric heat exchanger that itself includes a thermoelectric heat exchanger component according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of a thermoelectric heat exchanger component having a heat spreading lid that optimizes thermal interface resistance between the heat spreading lid and multiple thermoelectric devices and methods of fabrication thereof are disclosed. It should be noted that while much of the discussion herein focuses on embodiments of a thermoelectric heat exchanger including thermoelectric coolers (TECs), the concepts disclosed herein are equally applicable to other types of thermoelectric devices such as, for example, thermoelectric power generators (TEGs) utilized to generate power from recovered heat.

While the embodiments of the thermoelectric heat exchanger component can be utilized in any suitable thermoelectric system, FIG. 1 illustrates a thermoelectric refrigeration system 10 that includes a heat exchanger 12 having a thermoelectric heat exchanger component 14 according to one exemplary embodiment of the present disclosure. As illustrated, the thermoelectric refrigeration system 10 includes the heat exchanger 12, a cooling chamber 16, and a controller 18 that controls cooling within the cooling chamber 16. In this embodiment, the heat exchanger 12 includes a hot side heat sink 20, a cold side heat sink 22, and the thermoelectric heat exchanger component 14 disposed between the hot side heat sink 20 and the cold side heat sink 22. The thermoelectric heat exchanger component 14 includes multiple thin film thermoelectric devices, which in the thermoelectric refrigeration system 10 are thin film TECs. Each of the TECs has a hot side thermally coupled to the hot side heat sink 20 and a cold side that is thermally coupled to the cold side heat sink 22. When one or more of the TECs are activated by the controller 18, the activated TEC(s) operates to cool the cold side heat sink 22 and reject heat to the hot side heat sink 20 to thereby facilitate heat transfer to extract heat from the cooling chamber 16. More specifically, when one or more of the TECs are activated, the hot side heat sink 20 is heated to thereby create an evaporator and the cold side heat sink 22 is cooled to thereby create a condenser.

Acting as a condenser, the cold side heat sink 22 facilitates heat extraction from the cooling chamber 16 via an accept loop 24 coupled with the cold side heat sink 22. The accept loop 24 is thermally coupled to an interior wall 26 of the thermoelectric refrigeration system 10 that defines the cooling chamber 16. In one embodiment, the accept loop 24 is either integrated into the interior wall 26 or integrated directly onto the surface of the interior wall 26. The accept loop 24 is formed by any type of plumbing that allows for a working fluid, which is referred to herein as a cooling medium (e.g., a two-phase coolant), to flow or pass through the accept loop 24. Due to the thermal coupling of the accept loop 24 and the interior wall 26, the cooling medium extracts heat from the cooling chamber 16 as the cooling medium flows through the accept loop 24. The accept loop 24 may be formed of, for example, copper tubing, plastic tubing, stainless steel tubing, aluminum tubing, or the like.

The condenser formed by the cold side heat sink 22 and the accept loop 24 operates according to any suitable heat exchange technique. In one preferred embodiment, the accept loop 24 operates in accordance with thermosiphon principles (i.e., acts as a thermosiphon) such that the cooling medium travels from the cold side heat sink 22 through the accept loop 24 and back to the cold side heat sink 22 to thereby cool the cooling chamber 16 using two-phase, passive heat transport. In particular, passive heat exchange occurs through natural convection between the cooling medium in the accept loop 24 and the cooling chamber 16. Specifically, the cooling medium is condensed inside the cold side heat sink 22. The condensed cooling medium flows through the accept loop 24 via gravity forces.

Within the accept loop 24, passive heat exchange occurs between the environment in the cooling chamber 16 and the condensed cooling medium within the accept loop 24 such that the temperature in the cooling chamber 16 decreases and the temperature of the cooling medium increases and/or undergoes a phase change. When the temperature of the cooling medium increases, the density of the cooling medium decreases, such as through evaporation. Thus, in some embodiments, the accept loop 24 functions as an evaporator when cooling the cooling chamber 16. As a result, the evaporated cooling medium moves in an upward direction via buoyancy forces in the accept loop 24 towards the cold side heat sink 22. The evaporated cooling medium comes into thermal contact with the cold side heat sink 22, where heat exchange occurs between the cooling medium and the cold side heat sink 22. When heat exchange occurs between the cooling medium and the cold side heat sink 22, the cooling medium condenses and again flows through the accept loop 24 via gravity in order to extract additional heat from the cooling chamber 16.

As noted above, the heat exchanger 12 includes the thermoelectric heat exchanger component 14 disposed between the hot side heat sink 20 and the cold side heat sink 22. The TECs in the thermoelectric heat exchanger component 14 have hot sides (i.e., sides that are hot during operation of the TECs) that are thermally coupled with the hot side heat sink 20 and cold sides (i.e., sides that are cold during operation of the TECs) that are thermally coupled with the cold side heat sink 22. The TECs within the thermoelectric heat exchanger component 14 effectively facilitate heat transfer between the cold side heat sink 22 and the hot side heat sink 20. More specifically, when heat transfer occurs between the cooling medium in the accept loop 24 and the cold side heat sink 22, the active TECs transfer heat between the cold side heat sink 22 and the hot side heat sink 20.

Acting as an evaporator, the hot side heat sink 20 facilitates rejection of heat to an environment external to the cooling chamber 16 via a reject loop 28 coupled to the hot side heat sink 20. The reject loop 28 is thermally coupled to an outer wall 30, or outer skin, of the thermoelectric refrigeration system 10. The outer wall 30 is thermally isolated from the accept loop 24 and the interior wall 26 (and thus the cooling chamber 16) by, for example, appropriate insulation. In one embodiment, the reject loop 28 is integrated into the outer wall 30 or integrated onto the surface (e.g., the interior surface) of the outer wall 30. The reject loop 28 is formed of any type of plumbing that allows a working fluid, which is referred to herein as a heat transfer medium (e.g., a two-phase coolant), to flow or pass through the reject loop 28. Due to the thermal coupling of the reject loop 28 and the external environment, the heat transfer medium rejects heat to the external environment as the heat transfer medium flows through the reject loop 28. The reject loop 28 may be formed of, for example, copper tubing, plastic tubing, stainless steel tubing, aluminum tubing, or the like.

The evaporator formed by the hot side heat sink 20 and the reject loop 28 operates according to any suitable heat exchange technique. In one preferred embodiment, the reject loop 28 operates in accordance with thermosiphon principles (i.e., acts as a thermosiphon) such that the heat transfer medium travels from the hot side heat sink 20 through the reject loop 28 and back to the hot side heat sink 20 to thereby reject heat using two-phase, passive heat transport. In particular, passive heat exchange occurs through natural convection between the heat transfer medium in the reject loop 28 and the external environment. Specifically, the heat transfer medium is evaporated inside the hot side heat sink 28. The evaporated heat transfer medium flows through the reject loop 28 via buoyancy forces. Within the reject loop 28, passive heat exchange occurs between the evaporated heat transfer medium inside the reject loop 28 and the external environment such that the temperature of the evaporated heat transfer medium inside the reject loop 28 decreases such that the density of the heat transfer medium increases such as through condensation. Thus, in some embodiments, the reject loop 28 functions as a condenser when rejecting heat. As a result, the condensed heat transfer medium travels back through the reject loop 28 to the hot side heat sink 20 via gravity forces.

In one preferred embodiment, the heat exchanger 12 is not in direct thermal contact with the cooling chamber 16 and is instead thermally isolated from the cooling chamber 16. Likewise, the heat exchanger 12 is not in direct thermal contact with the outer wall 30 and is instead thermally isolated from the outer wall 30. Accordingly, the heat exchanger 12 is thermally isolated from both the cooling chamber 16 and the outer wall 30 of the thermoelectric refrigeration system 10. Importantly, the insulation of the heat exchanger 12 and a thermal diode effect of the accept and reject loops 24 and 28 when operating according to thermosiphon principles prevents heat leak-back into the cooling chamber 16 when the TECs are deactivated.

The controller 18 operates to control the TECs within the thermoelectric heat exchanger component 14 in order to maintain a desired set point temperature within the cooling chamber 16. The controller 18 operates to selectively activate/deactivate the TECs, selectively control an input current of the TECs, and/or selectively control a duty cycle of the TECs to maintain the desired set point temperature. Further, in some embodiments, the controller 18 is enabled to separately, or independently, control one or more and, in some embodiments, two or more subsets of the TECs, where each subset includes one or more different TECs. Thus, as an example, if there are four TECs in the thermoelectric heat exchanger component 14, the controller 18 may be enabled to separately control a first individual TEC, a second individual TEC, and a group of two TECs (i.e., a first and a second individual TEC and a group of two TECs). By this method, the controller 18 can, for example, selectively activate one, two, three, or four TECs independently, at maximized efficiency, as demand dictates.

While not essential for understanding the concepts disclosed and claimed herein, for more information regarding the thermoelectric refrigeration system 10, the interested reader is directed to U.S. patent application Ser. No. 13/836,525 entitled THERMOELECTRIC REFRIGERATION SYSTEM CONTROL SCHEME FOR HIGH EFFICIENCY PERFORMANCE, filed Mar. 15, 2013; U.S. patent application Ser. No. 13/888,791 entitled THERMOELECTRIC REFRIGERATION SYSTEM CONTROL SCHEME FOR HIGH EFFICIENCY PERFORMANCE, filed May 7, 2013; U.S. patent application Ser. No. 13/867,519 entitled SYSTEMS AND METHODS TO MITIGATE HEAT LEAK BACK IN A THERMOELECTRIC REFRIGERATION SYSTEM, filed Apr. 22, 2013; U.S. patent application Ser. No. 13/867,567 entitled CARTRIDGE FOR MULTIPLE THERMOELECTRIC MODULES, filed Apr. 22, 2013; U.S. patent application Ser. No. 13/867,589 entitled PARALLEL THERMOELECTRIC HEAT EXCHANGE SYSTEMS, filed Apr. 22, 2013; U.S. patent application Ser. No. 13/888,799 entitled THERMOELECTRIC HEAT EXCHANGE SYSTEM COMPRISING CASCADED COLD SIDE HEAT SINKS, filed May 7, 2013; U.S. patent application Ser. No. 13/888,820 entitled PHYSICALLY SEPARATED HOT SIDE AND COLD SIDE HEAT SINKS IN A THERMOELECTRIC REFRIGERATION SYSTEM, filed May 7, 2013; and U.S. patent application Ser. No. 13/888,833 entitled TWO-PHASE HEAT EXCHANGER MOUNTING, filed May 7, 2013, all of which are hereby incorporated herein by reference in their entireties.

Figure 2:
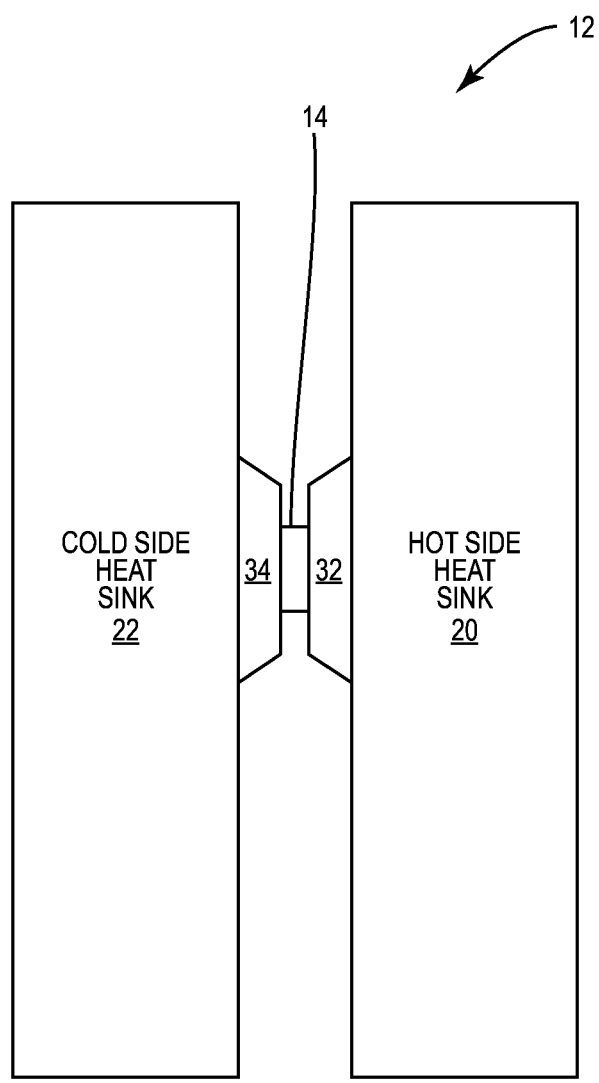
FIG. 2 is a more detailed illustration of the thermoelectric heat exchanger of FIG. 1 according to one embodiment of the present disclosure.

FIG. 2 is a more detailed illustration of the heat exchanger 12 of FIG. 1 according to one embodiment of the present disclosure. As illustrated, the heat exchanger 12 includes the thermoelectric heat exchanger component 14 between the hot side heat sink 20 and the cold side heat sink 22. In this embodiment, the thermoelectric heat exchanger component 14 is thermally and physically coupled to the hot side heat sink 20 by a heat spreader 32. In one embodiment, the heat spreader 32 may be part of the hot side heat sink 20. In another embodiment, the heat spreader 32 is separate from the hot side heat sink 20, in which case the heat spreader 32 is thermally and physically coupled to the hot side heat sink 20 via an appropriate thermal interface material (e.g., a thermal paste, a thermal grease, or the like). The heat spreader 32 is formed of a material having a high thermal conductivity (e.g., copper or copper aluminum) and operates to disperse heat generated at the hot sides of the TECs in the thermoelectric heat exchanger component 14, which have a relatively small surface area, to a larger area.

In a similar manner, in this embodiment, the thermoelectric heat exchanger component 14 is thermally and physically coupled to the cold side heat sink 22 by a heat spreader 34. In one embodiment, the heat spreader 34 may be part of the cold side heat sink 22. In another embodiment, the heat spreader 34 is separate from the cold side heat sink 22, in which case the heat spreader 34 is thermally and physically coupled to the cold side heat sink 22 via an appropriate thermal interface material (e.g., a thermal paste, a thermal grease, or the like). The heat spreader 34 is formed of a material having a high thermal conductivity (e.g., copper or copper aluminum) and operates to disperse heat, or more specifically in this case cold, generated at the cold sides of the TECs in the thermoelectric heat exchanger component 14, which have a relatively small surface area, to a larger area. It should be noted that the heat spreaders 32 and 34 are optional, at least in some implementations. More specifically, as discussed below, the thermoelectric heat exchanger component 14 includes heat spreading lids that provide a heat spreading function, in which case the heat spreaders 32 and 34 may not be needed.

Figure 3:
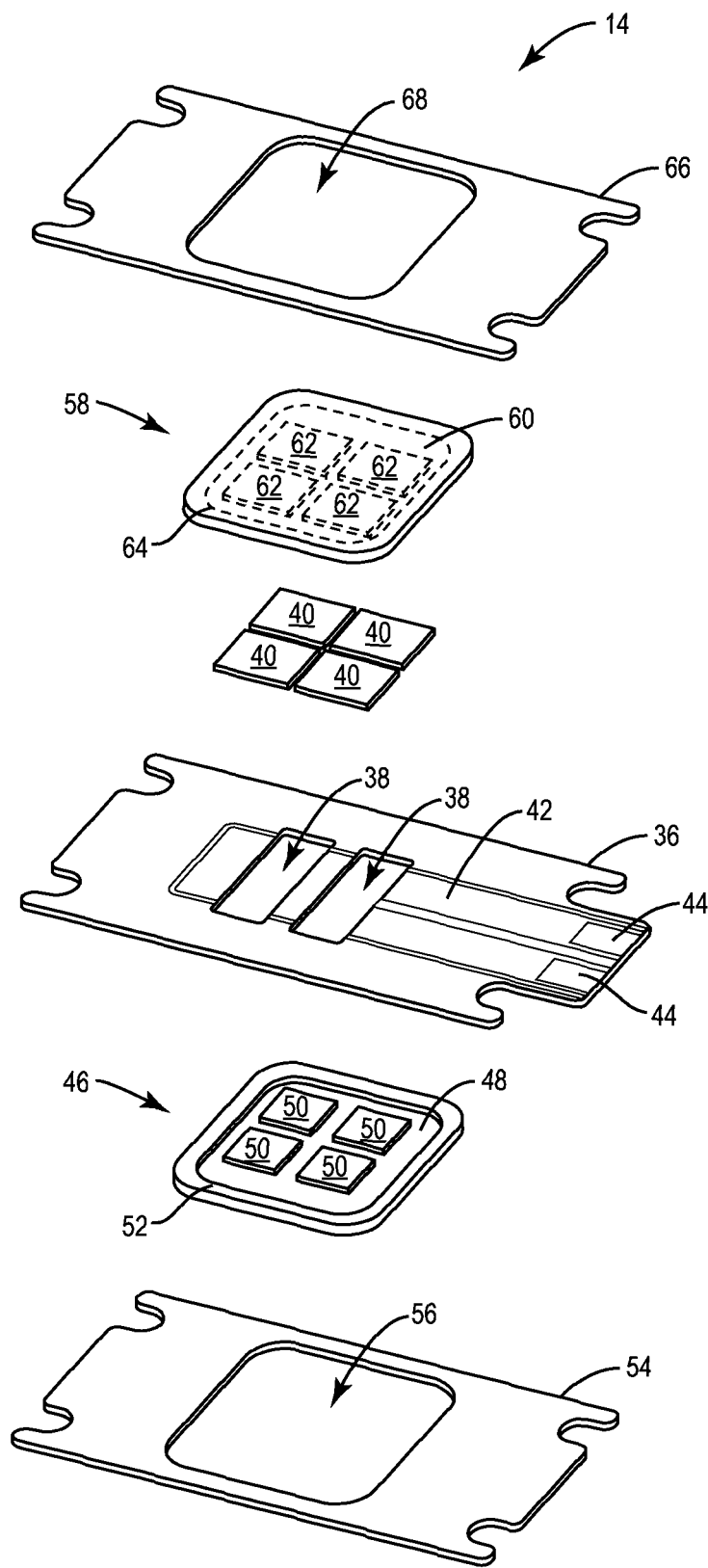
FIG. 3 is an exploded view of the thermoelectric heat exchanger component of FIG. 2 according to one embodiment of the present disclosure.

FIG. 3 illustrates the thermoelectric heat exchanger component 14 in more detail according to one embodiment of the present disclosure. As illustrated, the thermoelectric heat exchanger component 14 includes a circuit board 36 (e.g., a printed circuit board). The circuit board 36 includes holes 38 that extend through the circuit board 36, i.e., from a first surface of the circuit board 36 to a second surface of the circuit board 36. TECs 40 are electrically and physically attached to the circuit board 36 over the holes 38 such that, in one preferred embodiment, critical sides, which in this case are the hot sides of the TECs 40, are facing away from the circuit board 36 and less critical sides, which in this case are the cold sides of the TECs 40, are exposed at the second surface of the circuit board 36 through the holes 38. As discussed below, the holes 38 enable direct thermal contact with the cold sides of the TECs 40.

In this particular embodiment, the circuit board 36 includes a conductive trace 42 that electrically connects the TECs 40 in series as well as electrical contacts 44 that enable external circuitry to provide current to the TECs 40 to thereby activate the TECs 40. Note that while in this example there are four TECs 40 connected in series, the thermoelectric heat exchanger component 14 is not limited thereto. The thermoelectric heat exchanger component 14 may include any number of two or more TECs 40 connected in any desired manner. For example, all of the TECs 40 may be connected in series. As another example, two or more subsets of the TECs 40 may be connected in parallel (e.g., a set of 1 TEC 40 is in parallel with another set of 1 TEC 40 and a set of 2 TECs 40).

The thermoelectric heat exchanger component 14 also includes a heat spreading lid 46 over the cold sides of the TECs 40. The heat spreading lid 46 is formed of a material(s) having high thermal conductivity (e.g., copper or copper aluminum). The heat spreading lid 46 is small enough to ensure planar contact with the cold side heat sink 22 (or heat spreader 34) (FIGS. 1 and 2) but large enough to spread heat from the small surface areas of the cold sides of the TECs 40 to a much larger thermal interface area with a negligible temperature drop. The heat spreading lid 46 includes a body 48, pedestals 50, and a lip 52. The pedestals 50 extend from the body 48 of the heat spreading lid 46 toward the cold sides of the TECs 40. During fabrication, after the TECs 40 are attached to the circuit board 36, the heat spreading lid 46 is positioned over the cold sides of the TECs 40 such that the pedestals 50 are aligned with the cold sides of the TECs 40 exposed through the holes 38. The pedestals 50 of the heat spreading lid 46 are then thermally coupled to the cold sides of the corresponding TECs 40 via a thermal interface material. The thermal interface material is any suitable thermal interface material. In one embodiment, the thermal interface material is a thermal grease. In another embodiment, the thermal interface material is a solder having high thermal conductivity.

The pedestals 50 of the heat spreading lid 46 are fabricated to have the same height relative to the body 48 of the heat spreading lid 46 and are machined to have flat surfaces. The pedestals 50 can take any suitable shape. In one embodiment, each of the pedestals 50 is a parallelepiped. In another embodiment, each of the pedestals 50 is a frustum. The edges of the pedestals 50 are either vertical or sloped. Sloped edges can be used to allow thermal interface material to flow along the wall of the pedestals 50 rather than toward the TECs 40. For example, in one embodiment, the edges of the pedestals 50 are sloped at an angle of 45 degrees. At the interface between the pedestals 50 and the cold sides of the TECs 40, a surface area of each of the pedestals 50 is preferably slightly less (e.g., 1 to 10 percent less) than the surface area of the cold side of the corresponding TEC 40 exposed through the corresponding hole 38. In other words, the dimensions of each of the pedestals 50 at the interface with the corresponding TEC 40 are slightly smaller than those of the surface of the corresponding TEC 40. The slightly smaller surface area of the pedestals 50 ensures that excess thermal interface material collects on the pedestals 50 rather than edges (i.e., legs) of the corresponding TECs 40.

The lip 52 of the heat spreading lid 46 extends around a periphery of the heat spreading lid 46. The lip 52 extends from the body 48 of the heat spreading lid 46 toward the circuit board 36. As discussed below in detail, heights of the TECs 40 relative to the second surface (which in this example is the bottom surface) of the circuit board 36 can vary due to, for example, tolerances in the manufacturing, or fabrication, process of the TECs 40 and or the thermoelectric heat exchanger component 14. For example, the heights of the TECs 40 relative to the second surface of the circuit board 36 may vary by 0.1 to 3 millimeters (mm). The lip 52 of the heat spreading lid 46 has a height that ensures that at least a predefined minimum gap remains between the lip 52 and the circuit board 36. As discussed below, the gap between the lip 52 and the circuit board 36 is filled with an epoxy or similar attach material to thereby mechanically attach the heat spreading lid 46 to the circuit board 36.

In this embodiment, the thermoelectric heat exchanger component 14 also includes an insulating preform 54 that is positioned on the second surface (which in this example is the bottom surface) of the circuit board 36. The insulating preform 54 is formed of a suitable thermally insulating material such as, for example, a plastic material. The insulating preform 54 includes a hole 56 having dimensions that correspond to those of the heat spreading lid 46 such that, when the insulating preform 54 is positioned on the second surface of the circuit board 36, the heat spreading lid 46 passes through the hole 56 and the insulating preform 54 is in direct contact with the second surface of the circuit board 36.

In a similar manner, the thermoelectric heat exchanger component 14 also includes a heat spreading lid 58 over the hot sides of the TECs 40. The heat spreading lid 58 is formed of a material(s) having high thermal conductivity (e.g., copper or copper aluminum). The heat spreading lid 58 is small enough to ensure planar contact with the hot side heat sink 20 (or heat spreader 32) (FIGS. 1 and 2) but large enough to spread heat from the small surface areas of the hot sides of the TECs 40 to a much larger thermal interface area with a negligible temperature drop. The heat spreading lid 58 includes a body 60, pedestals 62, and a lip 64. The pedestals 62 extend from the body 60 of the heat spreading lid 58 toward the hot sides of the TECs 40. During fabrication, after the TECs 40 are attached to the circuit board 36, the heat spreading lid 58 is positioned over the hot sides of the TECs 40 such that the pedestals 62 are aligned with the hot sides of the TECs 40. The pedestals 62 of the heat spreading lid 58 are then thermally coupled to the hot sides of the corresponding TECs 40 via a thermal interface material. The thermal interface material is any suitable thermal interface material. In one embodiment, the thermal interface material is a thermal grease. In another embodiment, the thermal interface material is a solder having high thermal conductivity.

The pedestals 62 of the heat spreading lid 58 are fabricated to have the same height relative to the body 60 of the heat spreading lid 58 and are machined to have flat surfaces. The pedestals 62 can take any suitable shape. In one embodiment, each of the pedestals 62 is a parallelepiped. In another embodiment, each of the pedestals 62 is a frustum. The edges of the pedestals 62 are either vertical or sloped. Sloped edges can be used to allow thermal interface material to flow along the wall of the pedestals 50 rather than toward the TECs 40. For example, in one embodiment, the edges of the pedestals 62 are sloped at an angle of 45 degrees. At the interface between the pedestals 62 and the hot sides of the TECs 40, a surface area of each of the pedestals 62 is preferably slightly less (e.g., 1 to 10 percent less) than the surface area of the hot side of the corresponding TEC 40. In other words, the dimensions of each of the pedestals 62 at the interface with the corresponding TEC 40 are slightly smaller than those of the surface of the corresponding TEC 40. The slightly smaller surface area of the pedestals 62 ensures that excess thermal interface material collects on the pedestals 62 rather than edges (i.e., legs) of the corresponding TECs 40.

The lip 64 of the heat spreading lid 58 extends around a periphery of the heat spreading lid 58. The lip 64 extends from the body 60 of the heat spreading lid 58 toward the circuit board 36. As discussed below in detail, heights of the TECs 40 relative to the first surface (which in this example is the top surface) of the circuit board 36 can vary due to, for example, tolerances in the manufacturing, or fabrication, process of the TECs 40 and/or the thermoelectric heat exchanger component 14. For example, the heights of the TECs 40 relative to the first surface of the circuit board 36 may vary by 0.1 to 0.3 mm. The lip 64 of the heat spreading lid 58 has a height that ensures that at least a predefined minimum gap remains between the lip 64 and the circuit board 36. As discussed below, the gap between the lip 64 and the circuit board 36 is filled with an epoxy or similar attach material to thereby mechanically attach the heat spreading lid 58 to the circuit board 36.

Figure 4:
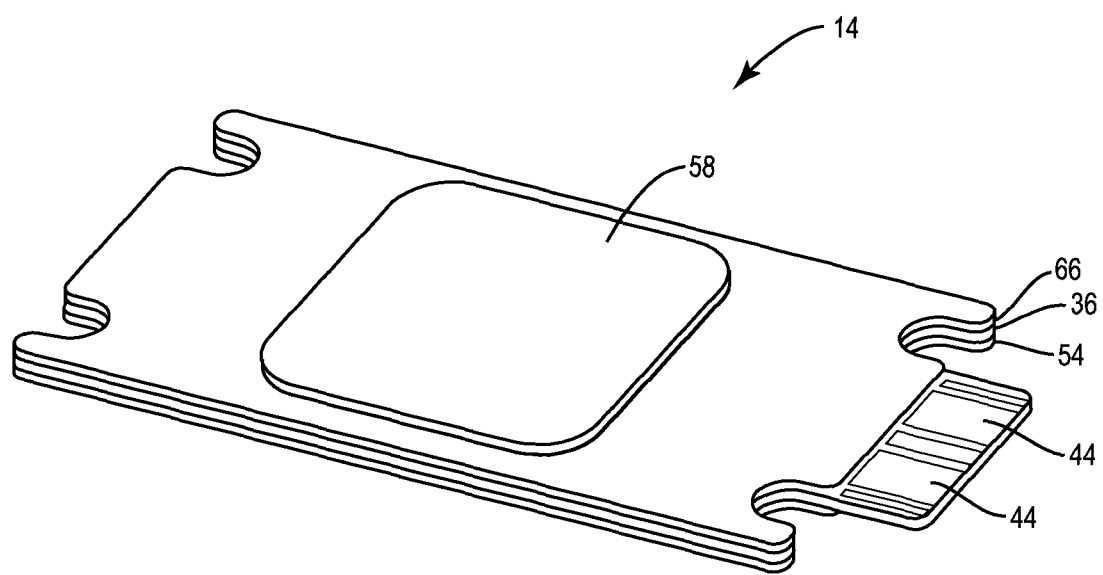
FIG. 4 is a collapsed view of the thermoelectric heat exchanger component of FIG. 3 according to one embodiment of the present disclosure.

In this embodiment, the thermoelectric heat exchanger component 14 also includes an insulating preform 66 that is positioned on the first surface (which in this example is the top surface) of the circuit board 36. The insulating preform 66 is formed of a suitable thermally insulating material such as, for example, a plastic material. The insulating preform 66 includes a hole 68 having dimensions that correspond to those of the heat spreading lid 58 such that, when the insulating preform 66 is positioned on the first surface of the circuit board 36, the heat spreading lid 58 passes through the hole 68 and the insulating preform 66 is in direct contact with the first surface of the circuit board 36. The insulating preforms 54 and 66 operate to reduce thermal shorting and heat leakage between the hot side and the cold side heat sinks 20 and 22. In addition, the insulating preforms 54 and 66 are relatively ridged structures that improve a ruggedness of the thermoelectric heat exchanger component 14. Lastly, the insulating preforms 54 and 66 can be easily removed as needed for rework or service. A collapsed view of the thermoelectric heat exchanger component 14 of FIG. 3 is illustrated in FIG. 4.

While not being limited by any particular advantages, the heat spreading lids 46 and 58 provide several advantages. First, the heat spreading lids 46 and 58 combined with the epoxy or similar attach material protect the TECs 40 from mechanical forces when, for example, the thermoelectric heat exchanger component 14 is attached to the hot side heat sink 20 and the cold side heat sink 22. In addition, substantial force may be applied to the thermoelectric heat exchanger component 14 when bolting the hot side and the cold side heat sinks 20 and 22 together during assembly of the heat exchanger 12. Such forces would normally crush the TECs 40. However, in the thermoelectric heat exchanger component 14, the forces are absorbed by the heat spreading lids 46 and 58 and the epoxy or other attach material between the lips 52 and 64 of the heat spreading lids 46 and 58 and the circuit board 36. In this manner, the TECs 40 are protected.

Figure 5:
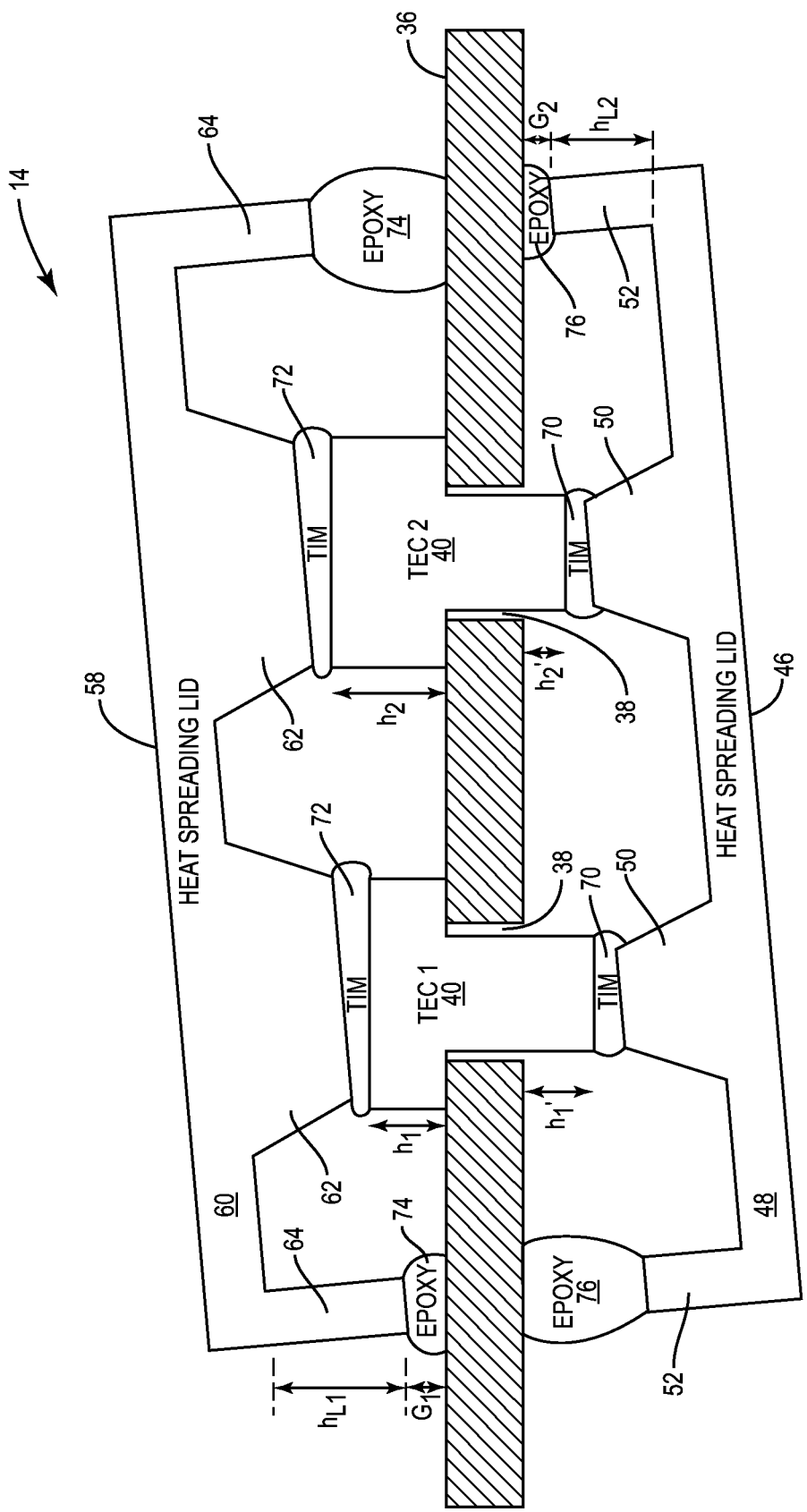
FIG. 5 illustrates a cross-section of the thermoelectric heat exchanger component of FIGS. 3 and 4 according to one embodiment of the present disclosure.

In addition, as discussed below in detail, the heat spreading lids 46 and 58 enable the thermal interface resistance at the interfaces between the heat spreading lids 46 and 58 and the TECs 40 to be optimized. More specifically, as illustrated in FIG. 5, heights of two or more of the TECs 40 may vary.

Using conventional techniques to attach the TECs 40 to the hot side and/or the cold side heat sinks 20 and 22 would result in a less than optimal thermal interface resistance for shorter TECs 40 because there would be a larger amount of thermal interface material between those shorter TECs 40 and the corresponding heat sink 20, 22. In contrast, the structure of the heat spreading lids 46 and 58 enable an orientation (i.e., tilt) of the heat spreading lids 46 and 58 to be adjusted to optimize the thickness of thermal interface material (TIM) 70, 72, and thus the thermal interface resistance, between the pedestals 50, 62 and the corresponding surfaces of the TECs 40.

In this example, TEC 1 has a height ($h_1$) relative to the first surface of the circuit board 36 that is less than a height ($h_2$) of TEC 2 relative to the first surface of the circuit board 36. As discussed below in detail, when the heat spreading lid 58 is positioned over the TECs 40, a ball point force (i.e., a force applied via a ball point) is applied to a center of the heat spreading lid 58. As a result, the heat spreading lid 58 settles at an orientation that optimizes a thickness of the thermal interface material 72 between each of the pedestals 62 and the corresponding TEC 40.

A height ($h_{L1}$) of the lip 64 of the heat spreading lid 58 is such that, for any possible combination of heights ($h_1$ and $h_2$) with a predefined tolerance range for the heights of the TECs 40 relative to the first surface of the circuit board 36, a gap ($G_1$) between the lip 64 and the circuit board 36 is greater than a predefined minimum gap. The predefined minimum gap is a non-zero value. In one particular embodiment, the predefined minimum gap is a minimum gap needed for an epoxy 74 to fill the gap ($G_1$) while maintaining a predefined amount of pressure or force between the heat spreading lid 58 and TECs 40. Specifically, the height ($h_{L1}$) of the lip 64 is greater than a minimum possible height of the TECs 40 relative to the first surface of the circuit board 36 plus the height of the pedestals 62, plus a predefined minimum height of the thermal interface material 72, plus some additional value that is a function of a maximum possible angle of the heat spreading lid 58 (which is a function of the minimum and maximum possible heights of the TECs 40) and a distance between the lip 64 and the nearest pedestal 62. In this embodiment, by adjusting the orientation of the heat spreading lid 58, the thickness of the thermal interface material 72, and thus the thermal interface resistance, for each of the TECs 40 is minimized.

In a similar manner, TEC 1 has a height ($h_1'$) relative to the second surface of the circuit board 36 that is greater than a height ($h_2'$) of TEC 2 relative to the second surface of the circuit board 36. As discussed below in detail, when the heat spreading lid 46 is positioned over the TECs 40, a ball point force (i.e., a force applied via a ball point) is applied to a center of the heat spreading lid 46. As a result, the heat spreading lid 46 settles at an orientation that optimizes a thickness of the thermal interface material 70 between each of the pedestals 50 and the corresponding TEC 40.

A height ($h_{L2}$) of the lip 52 of the heat spreading lid 46 is such that, for any possible combination of heights ($h_1'$ and $h_2'$) with a predefined tolerance range for the heights of the TECs 40 relative to the second surface of the circuit board 36, a gap ($G_2$) between the lip 52 and the circuit board 36 is greater than a predefined minimum gap. The predefined minimum gap is a non-zero value. In one particular embodiment, the predefined minimum gap is a minimum gap needed for an epoxy 76 to fill the gap ($G_2$) while maintaining a predefined amount of pressure or force between the heat spreading lid 46 and TECs 40. Specifically, the height ($h_{L2}$) of the lip 52 is greater than a minimum possible height of the TECs 40 relative to the second surface of the circuit board 36 plus the height of the pedestals 50, plus a predefined minimum height of the thermal interface material 70, plus some additional value that is a function of a maximum possible angle of the heat spreading lid 46 (which is a function of the minimum and maximum possible heights of the TECs 40) and a distance between the lip 52 and the nearest pedestal 50. In this embodiment, by adjusting the orientation of the heat spreading lid 46, the thickness of the thermal interface material 70, and thus the thermal interface resistance, for each of the TECs 40 is minimized.

In the embodiment of FIG. 5, the dimensions of the pedestals 50 and 62 are slightly less than the dimensions of the corresponding surfaces of the TECs 40 at the interfaces between the pedestals 50 and 62 and the corresponding surfaces of the TECs 40. As such, when applying the ball point force to the heat spreading lids 46 and 58, the excess thermal interface material 70 and 72 moves along the edges of the pedestals 50 and 62 and is thereby prevented from thermally shorting the legs of the TECs 40. It should also be pointed out that any force applied to the heat spreading lid 46 is absorbed by the lip 52, the epoxy 76, and the circuit board 36, which thereby protects the TECs 40. Likewise, any force applied to the heat spreading lid 58 is absorbed by the lip 64, the epoxy 74, and the circuit board 36, which thereby protects the TECs 40. In this manner, significantly more even and uneven forces can be applied to the thermoelectric heat exchanger component 14 without damaging the TECs 40 as compared to a comparable heat exchanger component without the heat spreading lids 46 and 58.

Figure 6:
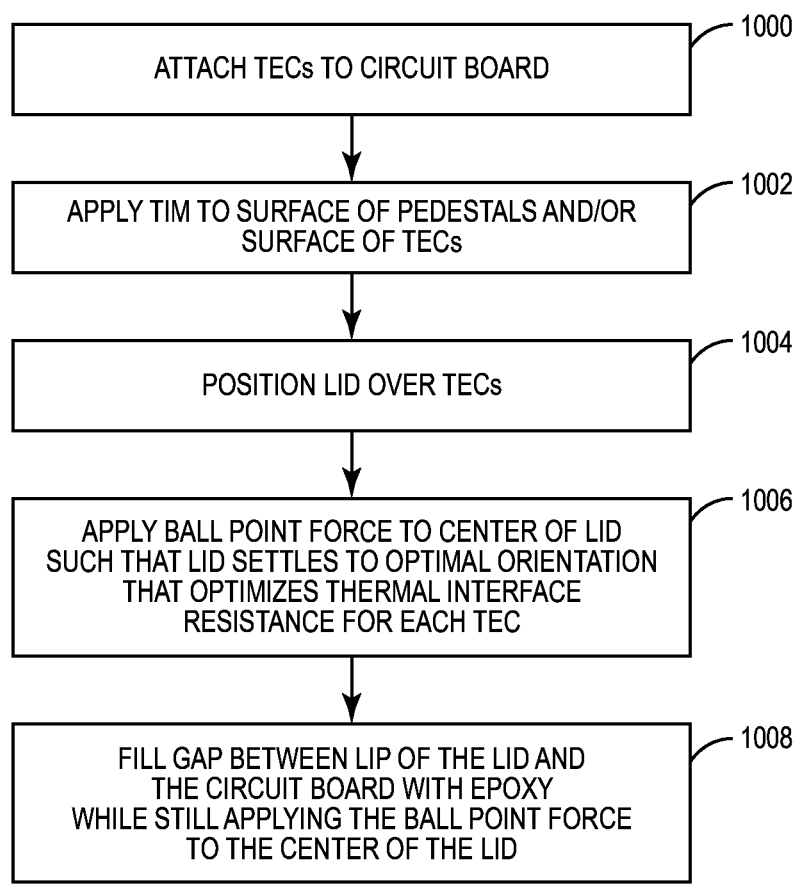
FIG. 6 is a flow chart that illustrates a process for fabricating the thermoelectric heat exchanger component of FIGS. 3 through 5 according to one embodiment of the present disclosure.

FIG. 6 is a flow chart that illustrates a process for fabricating the thermoelectric heat exchanger component 14 of FIGS. 3, 4, and 5 according to one embodiment of the present disclosure. As illustrated, the TECs 40 are first attached to the circuit board 36 (step 1000). As discussed above, the TECs 40 are attached to the circuit board 36 over the holes 38 in the circuit board 36 such that bottom surfaces of the TECs 40, which are preferably the less critical or cold sides of the TECs 40, are exposed through the holes 38. The TECs 40 are attached to the circuit board 36 using any suitable electrically conductive material such as, for example, solder. In addition, the thermal interface material 70, 72 is applied to the pedestals 50, 62 of the heat spreading lid 46, 58 and/or the appropriate surfaces of the TECs 40 (step 1002). For example, a thermal grease, or thermal paste, may be screen printed on the surfaces of the pedestals 50, 62. In one embodiment, the thermal interface material 72 for the most critical side of the TECs 40, which for the TECs 40 is the hot sides of the TECs 40, is a solder material, and the thermal interface material 70 for the less critical side of the TECs 40, which for the TECs 40 is the cold sides, is a more compliant thermal interface material (e.g., thermal grease). This would relieve stresses from Coefficient of Thermal Expansion (CTE) mismatch during thermal cycling from hot to cold, typically seen during on/off cycles of the TECs 40.

Next, the heat spreading lid 46, 58 is positioned over the TECs 40 such that the pedestals 50, 62 are aligned with the corresponding TECs 40 (step 1004). A ball point force is then applied to the center of the heat spreading lid 46, 58 such that the heat spreading lid 46, 58 settles to an orientation, or tilt, that optimizes the thermal interface resistance for each of the TECs 40 (step 1006). More specifically, by applying the ball point force to the center of the heat spreading lid 46, 58, the ball point force is evenly distributed across the heat spreading lid 46, 58. As a result, the heat spreading lid 46, 58 settles at the orientation that, as best as possible, minimizes the thickness of the thermal interface material 70, 72 for each of the TECs 40. In this manner, thermal interface resistance is optimized across all of the TECs 40. The magnitude of the ball point force can be optimized for the particular application. More specifically, the magnitude of the ball point force can be selected such that a desired minimum thickness of the thermal interface material 70, 72 is achieved while also not damaging the TECs 40. This optimal ball point force will vary depending on parameters such as the dimensions of the TECs 40, the material(s) used for the TECs 40, the desired minimum thickness of the thermal interface material 70, 72, and the material used for the thermal interface material 70, 72.

Lastly, while still applying the ball point force to the heat spreading lid 46, 58, the gap between the lip 52, 64 of the heat spreading lid 46, 58 and the corresponding surface of the circuit board 36 is filled with the epoxy 74, 76 or similar attach material (step 1008). The epoxy 74, 76 mechanically attaches the heat spreading lid 46, 58 to the circuit board 36. Note that steps 1002 through 1008 may be performed separately for each of the heat spreading lids 46 and 58 or, alternatively, some or all of steps 1002 through 1008 may be simultaneously performed for both of the heat spreading lids 46 and 58. After the process of FIG. 6 is complete, the insulating preforms 54 and 66, if desired, are positioned directly on the corresponding surfaces of the circuit board 36 as illustrated in FIGS. 3 and 4 either prior to or during assembly of the heat exchanger 12. Note that while the discussion herein focuses on embodiments of the thermoelectric heat exchanger component 14 having both of the heat spreading lids 46 and 58, the thermal heat exchanger component 14 may include only one of the heat spreading lids 46 and 58. However, using both of the heat spreading lids 46 and 58 provides a completely encapsulated, hermetic structure.

Figure 7:
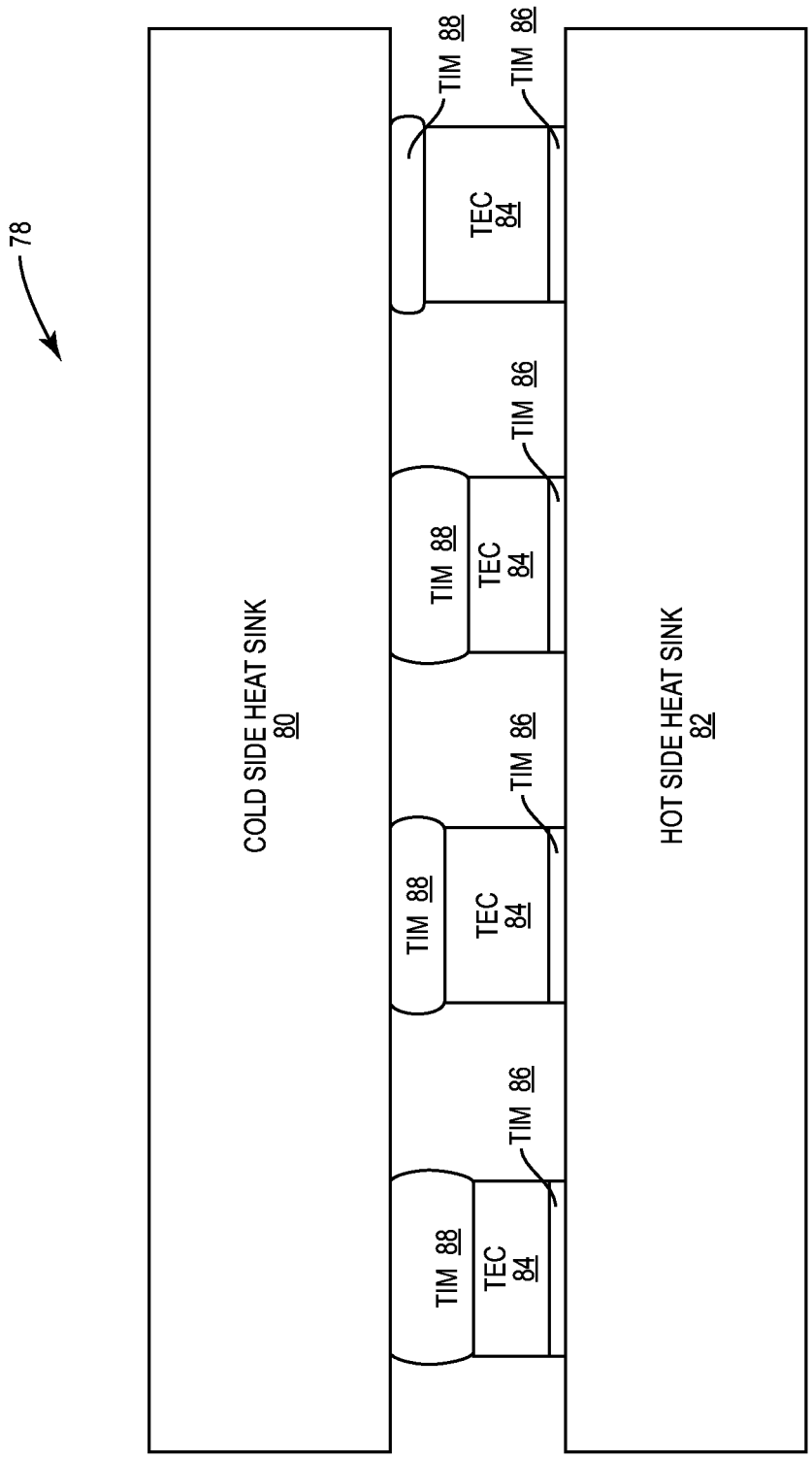
FIG. 7 illustrates a thermoelectric heat exchanger according to another embodiment of the present disclosure.

Thus far, the discussion has focused on embodiments of the heat exchanger 12 including the thermoelectric heat exchanger component 14. FIG. 7 illustrates another embodiment of a heat exchanger 78 that reduces thermal interface resistance. In this embodiment, the heat exchanger 78 includes a cold side heat sink 80, a hot side heat sink 82, and a number of TECs 84 disposed between the cold side heat sink 80 and the hot side heat sink 82. As illustrated, the TECs 84 have varying heights due to, for example, tolerances in a manufacturing process of the TECs 84. Hot sides of the TECs 84 are thermally and mechanically coupled to the hot side heat sink 82 via a thermal interface material 86, and cold sides of the TECs 84 are thermally and mechanically coupled to the cold side heat sink 80 via a thermal interface material 88. The hot sides of the TECs 84 dissipate both heat rejected by the cold side of the TECs 84 and heat generated by the TECs 84 themselves (i.e., heat generated due to power consumption of the TECs 84). As such, the hot sides of the TECs 84 are referred to as critical sides of the TECs 84. Note, however, that for other applications of thermoelectric devices, the cold sides of the thermoelectric devices may be the critical sides.

In this embodiment, the hot sides of the TECs 84 (i.e., the critical sides of the TECs 84) are attached to the hot side heat sink 82 such that a minimum thickness of the thermal interface material 86 is achieved between each individual TEC 84 and the hot side heat sink 82. In this manner, the thermal interface resistance between each of the individual TECs 84 and the hot side heat sink 82 is minimized. The thermal interface material 86 can be any suitable thermal interface material such as, for example, thermal grease or paste, solder, thermally conductive pads, or the like. Further, the hot side heat sink 82 (or alternatively a heat spreader(s) between the TECs 84 and the hot side heat sink 82) may include features that hold the TECs 84 in place. In one embodiment, the cold sides of the TECs 84 are exposed during attachment of the TECs 84 to the hot side heat sink 82 and, as such, a force can be applied to each of the TECs 84 individually, which results in a consistent minimum bondline or thermal interface material thickness between the hot sides of the TECs 84 and the hot side heat sink 82 that is dependent only on the flatness of surface of the hot side heat sink 82, the flatness of the hot sides of the TECs 84, and the material properties of the thermal interface material 86.

On the cold side (i.e., the less critical side), the bondline or thickness of the thermal interface material 88 is a function of all of the aforementioned parameters as well as the height variations of the TECs 84. As such, the thickness of the thermal interface material 88 will be greater for shorter TECs 84 than for taller TECs 84, as illustrated. In one embodiment, the thermal interface material 88 has a higher thermal conductivity than the thermal interface material 86 in order to at least partially offset the increased thickness of the thermal interface material 88 with respect to at least some of the TECs 84.

The thickness of the thermal interface material between a TEC and a heat sink is preferably as thin as possible in order to minimize thermal interface resistance. Minimization of the thickness of the thermal interface material between a TEC and a heat sink can be achieved, at least in part, by ensuring that the heat sink is not tilted relative to the TEC. With a small TEC disposed between much larger heat sinks, this can be a mechanical challenge. Typically, this would require elaborate and potentially expensive mechanical structures to ensure parallel surfaces throughout the structure with sufficient force to achieve minimum thermal interface material thickness.

Figure 8:
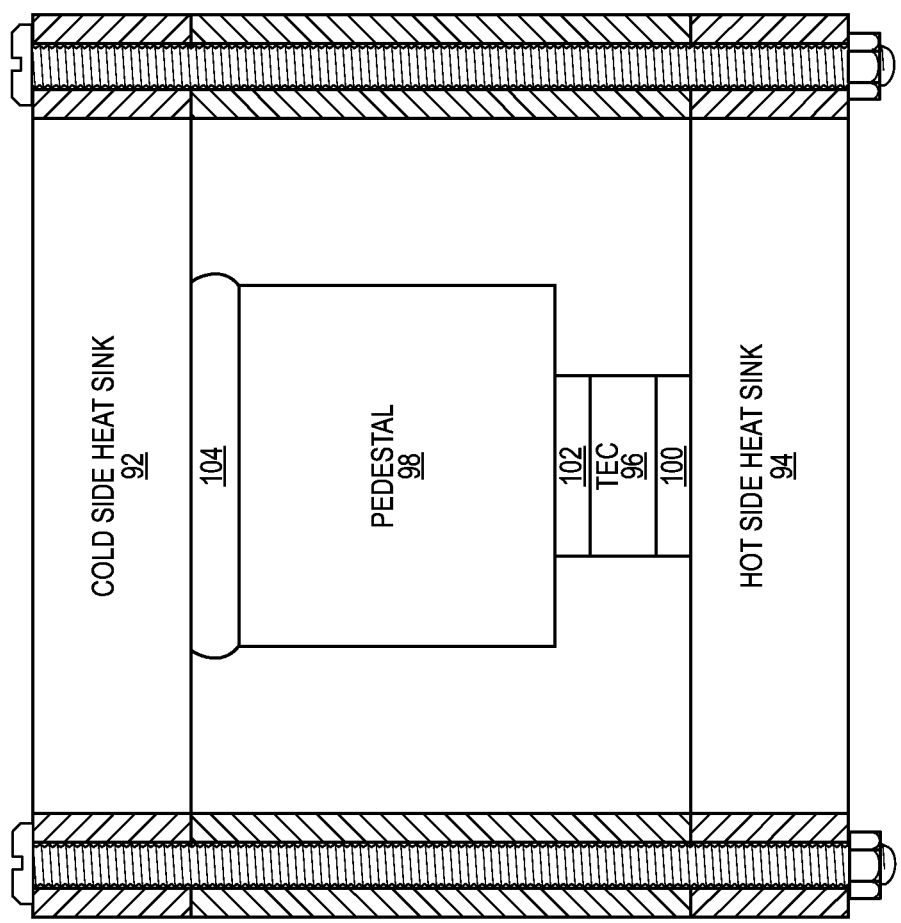
FIG. 8 illustrates a thermoelectric heat exchanger according to yet another embodiment of the present disclosure.

In this regard, FIG. 8 illustrates a heat exchanger 90 that minimizes thermal interface resistance between a TEC and corresponding heat sinks according to another embodiment of the present disclosure. In this embodiment, the heat exchanger 90 includes a cold side heat sink 92, a hot side heat sink 94, and a TEC 96 disposed between the cold side heat sink 92 and the hot side heat sink 94. The heat exchanger 90 also includes a separate pedestal 98 that provides desired planarity and heat spreading. Note that the pedestal 98 may be desired in applications where, for example, a thickness of an insulation between the cold side and the hot side heat sinks 92 and 94 is greater than a thickness of the TEC 96. As illustrated, the hot side of the TEC 96 is thermally and mechanically coupled to the hot side heat sink 94 via a thermal interface material 100, the cold side of the TEC 96 is thermally and mechanically coupled to the pedestal 98 via a thermal interface material 102, and the pedestal 98 is thermally and mechanically coupled to the cold side heat sink 92 via a thermal interface material 104. The thermal interface materials 100, 102, and 104 may be any suitable thermal interface material. Further, the thermal interface materials 100, 102, and 104 may be the same thermal interface material or, alternatively, some or all of the thermal interface materials 100, 102, and 104 may be different thermal interface materials.

Since more power is rejected at the hot side of the TEC 96, the pedestal 98 is preferably between the TEC 96 and the cold side heat sink 92 as illustrated. A cross-sectional area of the pedestal 98 is closer to a cross-sectional area of the TEC 96 than that of the cold side heat sink 92, which in turn makes it much easier to achieve parallelism (e.g., the pedestal 98 is much easier to handle than a combined heat sink and pedestal and therefore can be more easily, accurately, and precisely placed to achieve the desired planarity). The pedestal 98 could be such that the surface of the pedestal 98 that is in thermal contact with the TEC 96 is smaller than the surface of the pedestal 98 that is in thermal contact with the cold side heat sink 92. There is then a thermal interface between the pedestal 98 and the cold side heat sink 92 that, due to its larger size, has a lower thermal interface resistance. As an example, the pedestal 98 may be in the shape of an upside down frustum of, for instance, a cone or a pyramid. Further, the pedestal 98 can be formed of any suitable high conductivity material. For example, the pedestal 98 can be formed of copper, and the cold side heat sink 92 can be formed of aluminum. As a result, there is heat spreading in the pedestal 98 due to the shape and the material. The pedestal 98 and the interfaces between the pedestal 98 and the TEC 96 and the cold side heat sink 92 can be optimized to improve heat spreading. In one embodiment, dimensions of the pedestal 98 at the interface to the TEC 96 are the same as or substantially the same as those of the TEC 96, and the dimensions of the pedestal 98 at the interface to the cold side heat sink 92 are larger.

Those skilled in the art will recognize improvements and modifications to the preferred embodiments of the present disclosure. All such improvements and modifications are considered within the scope of the concepts disclosed herein and the claims that follow.

What is claimed is:

1. A thermoelectric heat exchanger component, comprising:
   a circuit board;
   a plurality of thermoelectric devices attached to the circuit board, wherein two or more of the plurality of thermoelectric devices have different heights relative to the circuit board;
   a heat spreading lid over the plurality of thermoelectric devices; and
   a thermal interface material between the plurality of thermoelectric devices and the heat spreading lid;
   wherein the heat spreading lid is oriented such that the thickness of the thermal interface material, and thus a thermal interface resistance, is minimized for the plurality of thermoelectric devices.

2. The thermoelectric heat exchanger component of claim 1 wherein:
   the plurality of thermoelectric devices are attached to a first surface of the circuit board and include a first surface opposite the first surface of the circuit board and a second surface opposite the first surface;
   the two or more of the plurality of thermoelectric devices have different heights relative to the first surface of the circuit board;
   the heat spreading lid is on the first surfaces of the plurality of thermoelectric devices opposite the first surface of the circuit board; and
   the thermal interface material is between the first surfaces of the plurality of thermoelectric devices and the heat spreading lid.

3. The thermoelectric heat exchanger of claim 2 further comprising:
   a second heat spreading lid on the second surfaces of the plurality of thermoelectric devices exposed at a second surface of the circuit board through one or more holes through the circuit board; and
   a second thermal interface material between the plurality of thermoelectric devices and the second heat spreading lid;
   wherein the second heat spreading lid is oriented such that the thickness of the second thermal interface material, and thus a thermal interface resistance, is minimized for the plurality of thermoelectric devices.

4. The thermoelectric heat exchanger component of claim 2 wherein the heat spreading lid comprises:
   a body; and
   a plurality of pedestals of equal heights that extend from the body toward the first surfaces of the plurality of thermoelectric devices such that each pedestal of the plurality of pedestals is aligned with a corresponding one of the plurality of thermoelectric devices;
   wherein the thermal interface material is between a surface of each pedestal of the plurality of pedestals and the first surface of the corresponding one of the plurality of thermoelectric devices, and the orientation of the heat spreading lid is such that the thickness of the thermal interface material between each pedestal of the plurality of pedestals and the first surface of the corresponding one of the plurality of thermoelectric devices is minimized for the plurality of thermoelectric devices.

5. The thermoelectric heat exchanger component of claim 4 wherein the thermal interface material is one of a group consisting of: solder and thermal grease.

6. The thermoelectric heat exchanger component of claim 4 wherein each pedestal of the plurality of pedestals is a parallelepiped.

7. The thermoelectric heat exchanger component of claim 4 wherein each pedestal of the plurality of pedestals is a frustum.

8. The thermoelectric heat exchanger component of claim 4 wherein an area of the surface of each pedestal of the plurality of pedestals is in a range of and including 1 to 10 percent smaller than an area of the first surface of the corresponding one of the plurality of thermoelectric devices.

9. The thermoelectric heat exchanger component of claim 4 wherein the heat spreading lid further comprises a lip that extends from the body of the heat spreading lid around a periphery of the heat spreading lid.

10. The thermoelectric heat exchanger component of claim 9 wherein a height of the lip relative to the body of the heat spreading lid is such that, for any combination of heights of the plurality of thermoelectric devices within a predefined tolerance range, at least a predefined minimum gap is maintained between the lip of the heat spreading lid and the first surface of the circuit board, wherein the at least the predefined minimum gap is greater than zero.

11. The thermoelectric heat exchanger component of claim 10 further comprising an attach material that fills the at least the predefined minimum gap between the lip of the heat spreading lid and the first surface of the circuit board around the periphery of the heat spreading lid.

12. The thermoelectric heat exchanger component of claim 11 wherein the lip of the heat spreading lid and the attach material absorb force applied to the heat spreading lid so as to protect the plurality of thermoelectric devices.

13. The thermoelectric heat exchanger component of claim 11 wherein the attach material is an epoxy.

14. The thermoelectric heat exchanger component of claim 11 further comprising a thermal insulator preform having a hole with dimensions that correspond to dimensions of the heat spreading lid, the thermal insulator preform being positioned over the circuit board such that the heat spreading lid passes through the hole in the thermal insulator preform.

15. The thermoelectric heat exchanger component of claim 1 wherein:
   the plurality of thermoelectric devices are attached to a first surface of the circuit board and include a first surface opposite the first surface of the circuit board and a second surface opposite the first surface;

the heat spreading lid is over the first surfaces of the plurality of thermoelectric devices that are exposed at a second surface of the circuit board through one or more holes through the circuit board;

the two or more of the plurality of thermoelectric devices have different heights relative to the second surface of the circuit board; and the thermal interface material is between the first surfaces of the plurality of thermoelectric devices and the heat spreading lid.

16. The thermoelectric heat exchanger component of claim 15 wherein the heat spreading lid comprises:

a body; and a plurality of pedestals of equal heights that extend from the body toward the first surfaces of the plurality of thermoelectric devices such that each pedestal of the plurality of pedestals is aligned with a corresponding one of the plurality of thermoelectric devices;

wherein the thermal interface material is between each pedestal of the plurality of pedestals and the first surface of the corresponding one of the plurality of thermoelectric devices, and the heat spreading lid is oriented such that the thickness of the thermal interface material between each pedestal of the plurality of pedestals and the first surface of the corresponding one of the plurality of thermoelectric devices, and thus a thermal interface resistance, is minimized for the plurality of thermoelectric devices.

17. The thermoelectric heat exchanger component of claim 16 wherein the thermal interface material is one of a group consisting of: solder and thermal grease.

18. The thermoelectric heat exchanger component of claim 16 wherein each pedestal of the plurality of pedestals is a parallelepiped.

19. The thermoelectric heat exchanger component of claim 16 wherein each pedestal of the plurality of pedestals is a frustum.

20. The thermoelectric heat exchanger component of claim 16 wherein an area of a surface of each pedestal of the plurality of pedestals is in a range of and including 1 to 10 percent smaller than an area of the first surface of the corresponding one of the plurality of thermoelectric devices.

21. The thermoelectric heat exchanger component of claim 16 wherein the heat spreading lid further comprises a lip that extends from the body of the heat spreading lid around a periphery of the heat spreading lid.

22. The thermoelectric heat exchanger component of claim 21 wherein a height of the lip relative to the body of the heat spreading lid is such that, for any combination of heights of the plurality of thermoelectric devices within a predefined tolerance range, at least a predefined minimum gap is maintained between the lip of the heat spreading lid and the second surface of the circuit board, wherein the at least the predefined minimum gap is greater than zero.

23. The thermoelectric heat exchanger component of claim 22 further comprising an attach material that fills the at least the predefined minimum gap between the lip of the heat spreading lid and the second surface of the circuit board around the periphery of the heat spreading lid.

24. The thermoelectric heat exchanger component of claim 23 wherein the lip of the heat spreading lid and the attach material absorb force applied to the heat spreading lid so as to protect the plurality of thermoelectric devices.

25. The thermoelectric heat exchanger component of claim 23 wherein the attach material is an epoxy.

26. The thermoelectric heat exchanger component of claim 23 further comprising a thermal insulator preform having a hole with dimensions that correspond to dimensions of the heat spreading lid, the thermal insulator preform being positioned over the circuit board such that the heat spreading lid passes through the hole in the thermal insulator preform.

* * * * *